United States Patent
Wu et al.

(10) Patent No.: US 9,541,832 B2
(45) Date of Patent: Jan. 10, 2017

(54) PHOTOSENSITIVE RESIN COMPOSITION, PROTECTIVE FILM AND ELEMENT HAVING THE SAME

(71) Applicant: CHI MEI CORPORATION, Tainan (TW)

(72) Inventors: Ming-Ju Wu, Tainan (TW); Chun-An Shih, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/733,969

(22) Filed: Jun. 9, 2015

(65) Prior Publication Data

US 2015/0378256 A1 Dec. 31, 2015

(30) Foreign Application Priority Data

Jun. 27, 2014 (TW) .............................. 103122315 A

(51) Int. Cl.
| | | |
|---|---|---|
| *G03F 7/075* | (2006.01) | |
| *G03F 7/038* | (2006.01) | |
| *G03F 7/40* | (2006.01) | |
| *C09D 183/04* | (2006.01) | |
| *C09D 5/16* | (2006.01) | |
| *G03F 7/38* | (2006.01) | |
| *G03F 7/023* | (2006.01) | |

(52) U.S. Cl.
CPC ........... *G03F 7/0757* (2013.01); *C09D 5/1675* (2013.01); *C09D 183/04* (2013.01); *G03F 7/0233* (2013.01); *G03F 7/038* (2013.01); *G03F 7/38* (2013.01); *G03F 7/40* (2013.01)

(58) Field of Classification Search
CPC .............. G03F 7/075; G03F 7/38; G03F 7/40; G03F 7/0007; G03F 7/0226; G03F 7/0233; G03F 7/028; G03F 7/033; G02B 1/105; C09D 5/1675; C09D 183/04; C09D 183/06
USPC ........... 430/18, 281.1, 191, 192, 193, 280.1, 430/288.1, 272.1, 330, 331, 905, 910; 524/488; 427/387; 525/474
See application file for complete search history.

(56) References Cited

U.S. PATENT DOCUMENTS

| | | | | |
|---|---|---|---|---|
| 5,143,816 A | * | 9/1992 | Mizutani ............... | G03F 7/0752 430/165 |
| 5,587,502 A | * | 12/1996 | Moren .................... | C07F 7/182 524/588 |
| 8,933,144 B2 | * | 1/2015 | Enomoto .................. | C08F 2/44 347/102 |
| 2009/0197986 A1 | * | 8/2009 | Lee .......................... | C09D 4/00 522/6 |
| 2011/0232726 A1 | * | 9/2011 | Aiba ........................ | B05D 7/54 136/251 |
| 2012/0136122 A1 | * | 5/2012 | Shirai .................. | C08G 77/442 525/342 |
| 2012/0196949 A1 | | 8/2012 | Heo et al. | |
| 2013/0310497 A1 | * | 11/2013 | Wu .......................... | C08K 5/42 524/159 |
| 2014/0051017 A1 | * | 2/2014 | Hsieh .................... | G03F 7/0007 430/18 |
| 2015/0376355 A1 | * | 12/2015 | Wu ............................ | C08J 5/18 522/62 |

FOREIGN PATENT DOCUMENTS

| | | | |
|---|---|---|---|
| CN | 103864586 A | 6/2014 | |
| JP | 2007017481 A * | 1/2007 | ............ G03F 7/075 |
| JP | 2009-075329 A | 4/2009 | |
| JP | 2009-229892 A | 10/2009 | |
| TW | 200519081 A | 6/2005 | |
| TW | 201209518 A | 3/2012 | |
| TW | 201413388 A | 4/2014 | |

* cited by examiner

*Primary Examiner* — Amanda C Walke
(74) *Attorney, Agent, or Firm* — CKC & Partners Co., Ltd.

(57) ABSTRACT

The present invention relates to a photosensitive resin composition, a protective film and an element having the same. The aforementioned photosensitive resin composition includes a polysiloxane resin (A), an alkali-soluble resin (B), an ortho-naphthoquinone diazide sulfonic acid ester (C) and a solvent (D). The alkali-soluble resin (B) is copolymerized by an unsaturated carboxylic acid or unsaturated carboxylic anhydride compound (b1), a fluorene derivative having a double-bond group (b2) and an unsaturated compound having an acid-decomposable group (b3).

7 Claims, No Drawings

PHOTOSENSITIVE RESIN COMPOSITION, PROTECTIVE FILM AND ELEMENT HAVING THE SAME

RELATED APPLICATIONS

This application claims priority to Taiwan Application Serial Number 103122315, filed on Jun. 27, 2014, which is herein incorporated by reference.

BACKGROUND

Field of Invention

The present invention relates to a photosensitive resin composition, a protective film formed by the photosensitive resin composition and a liquid crystal display element having the protective film. More particularly, the present invention provides a photosensitive resin composition with excellent resistance to development and leveling resistance, a protective film formed by the photosensitive resin composition and a liquid crystal display element having the protective film.

Description of Related Art

In electrical element, such as thin film transistor (TFT) liquid crystal display element, magnetic head element, integrated circuit element, solid imaging element and the like, a protective film (also called as interlayer insulating film) generally is disposed between wirings to achieve the efficacies of insulating and protective.

The materials for producing the protective film generally is selected from materials that can obtain a desired pattern by less steps and the protective film has better flatness. The materials for producing the protective film can be photosensitive resin compositions.

JP Patent publication No. 2009-075329 discloses a photosensitive resin composition for a protective film. The photosensitive resin composition for the protective film can increase adherence of the protective film by transition metal compound having structures shown as following Formula (VIII-1) or Formula (VIII-2):

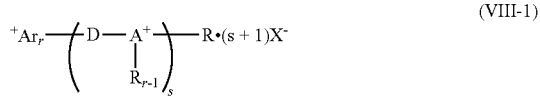
(VIII-1)

in Formula (VIII-1), A represents elements of group VIA to group VIIA with an atomic valence of r, and r represents 1 or 2; R represents an aromatic group of 6 to 30 carbons, a heterocyclic group of 4 to 30 carbons, an alkyl group of 1 to 30 carbons, an alkenyl group of 2 to 30 carbons or an alkynyl group of 2 to 30 carbons; D represents a group shown as following Formula (VIII-1-1); X⁻ represents a group shown as following Formula (VIII-1-2); and s represents an integer of 0 to 3:

in Formula (VIII-1-1) or (VIII-1-2), E represents a divalent group, such as an alkylene group of 1 to 8 carbons, an arylene group of 6 to 20 carbons, a heterocyclic compound of 8 to 20 carbons or the like; t represents an integer of 0 to 5; Rf represents an alkyl group that has at least 80% of hydrogen atoms are substituted by fluorine atoms; and u represents an integer of 1 to 5:

(VIII-2)

in Formula (VIII-2), M represents transition metal elements of group VIB to group VIII; L1 and L2 are ligands of the transition metals, L1 represents an aromatic compound of 6 to 24 carbons or a heterocyclic group of 4 to 20 carbons, and L2 represents anions of indene, fluorene or cyclopiperylene; the X⁻ has the same definition as aforementioned definition in Formula (VII-1), rather than focusing or mentioning it in detail; w and y represents an integer of 0 to 2, and the sum of (w+y) is 2; and z represents 1 or 2.

Moreover, JP Patent publication No. 2009-229892 disclosed a photosensitive resin composition for a protective film. The photosensitive resin composition includes silesquioxane having an aromatic group of 6 to 15 carbons. The silesquioxane having an aromatic group can increase sensitivity, transmission rate and adherence of the protective film.

However, although the aforementioned two photosensitive resin compositions can enhance the adherence of the protective film, the protective film had defects of poor resistance to development and poor leveling resistance, thus lowering accuracy of the desired patterns, and further reducing the performance of the aforementioned electrical elements.

Accordingly, there is a need to provide photosensitive resin composition for a protective film with excellent resistance to development and leveling resistance for improving the disadvantages of the aforementioned defects of the conventional protective film.

SUMMARY

Therefore, an aspect of the present invention provides a photosensitive resin composition. The photosensitive resin composition can increase a resistance to development and a leveling resistance of a protective film.

Another aspect of the present invention provides a protective film. The protective film is formed by the aforementioned photosensitive resin composition.

A further aspect of the present invention provides an element having a protective film. The element has the aforementioned protective film.

According to the aforementioned aspects, the photosensitive resin composition comprising a polysiloxane resin (A), an alkali-soluble resin (B), an ortho-naphthoquinone diazide sulfonic acid ester (C) and a solvent (D) all of which are described in details as follows.

Photosensitive Resin Composition

Polysiloxane Resin (A)

There is no particular limitations in kinds of the polysiloxane resin (A), and the polysiloxane resin (A) can meet the requirements of the present invention. The polysiloxane resin (A) is formed by subjecting a mixture to a polymerization reaction [i.e. hydrolysis reaction and partially condensation]. The mixture can include silane monomer, siloxane prepolymer or a combination thereof.

The polysiloxane resin (A) is obtained by polycondensing a silane monomer having a structure of Formula (I):

$$Si(Y_1)_a(OY_2)_{4-a} \quad (I)$$

in the Formula (I), $Y_1$ respectively represents a hydrogen atom, an alkyl group of 1 to 10 carbons, an alkene group of 2 to 10 carbons, an aromatic group of 6 to 15 carbons, an alkyl group having an anhydride group, an alkyl group having an epoxy group or an alkoxy group having an epoxy group; $Y_2$ respectively represents a hydrogen atom, an alkyl group of 1 to 6 carbons, an acetyl group of 1 to 6 carbons or an aromatic group of 6 to 15 carbons; and a represents an integer of 0 to 3.

When the aforementioned $Y_1$ represents an alkyl group of 1 to 10 carbons, $Y_1$ can be methyl, ethyl, n-propyl, isopropyl, n-butyl, tert-butyl, n-hexyl, or n-decyl. $Y_1$ can also represent an alkyl group having other substituents, such as trifluoromethyl, 3,3,3-trifluoropropyl, 3-aminopropyl, 3-mercaptopropyl, or 3-isocyanatopropyl.

When the aforementioned $Y_1$ is an alkenyl group of 2 to 10 carbons, $Y_1$ can be a vinyl group. Moreover, $Y_1$ can also be an alkenyl group having other substituents, such as 3-acryloxypropyl or 3-methylacryloxypropyl.

When $Y_1$ represents an aromatic group of 6 to 15 carbons, $Y_1$ can be phenyl, tolyl, or naphthyl. $Y_1$ can also be an aromatic group having other substituents, such as o-hydroxyphenyl, 1-(o-hydroxyphenyl)ethyl, 2-(o-hydroxyphenyl)ethyl, or 4-hydroxy-5-(p-hydroxyphenylcarbonyloxy)pentyl.

When $Y_1$ represents an alkyl group having an anhydride group, the number of carbon atoms of the alkyl group is preferably 1 to 10. The aforementioned anhydride group is a group formed by subjecting a dicarboxylic acid compound to an intramolecular dehydration, and the dicarboxylic acid compound can be succinic acid or glutaric acid. The alkyl group having an anhydride group can be a group having a structure of the following formulas (I-1) to (I-3):

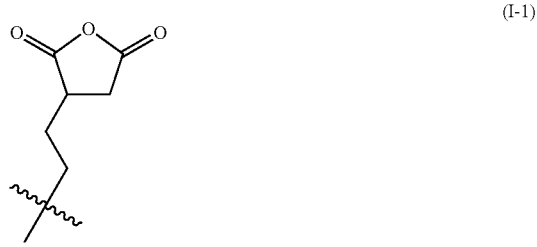

(I-1)

(I-2)

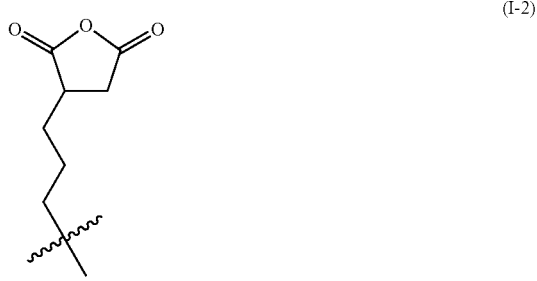

(I-3)

When $Y_1$ represents an alkyl group having an epoxy group, the alkyl group can be preferably an alkyl group of 1 to 10 carbons, and the epoxy group is a group formed by subjecting a diol to an intramolecular dehydration. The diol can be propanediol, butanediol, or pentanediol. The alkyl group having an epoxy group can include oxetanylpentyl or 2-(3,4-epoxycyclohexyl)ethyl.

When $Y_1$ represents an alkoxy group having an epoxy group, the alkoxy group preferably can be an alkoxy group of 1 to 10 carbons. The alkoxy group having an epoxy group can include glycidoxypropyl or 2-oxetanylbutoxy.

When $Y_2$ represents an alkyl group of 1 to 6 carbons, $Y_2$ can be methyl, ethyl, n-propyl, isopropyl, or n-butyl. When the aforementioned $Y_2$ represents an acyl group of 1 to 6 carbons, $Y_2$ can be an acetyl. When $Y_2$ represents an aromatic group of 6 to 15 carbons, $Y_2$ can be phenyl.

When a represents 2 or 3, a plurality of $Y_1$ can be the same or different. When a represents 0 to 2, a plurality of $Y_2$ can be the same or different.

When the aforementioned a is 0, the silane monomer having a structure of Formula (I) can be a tetrafunctional silane monomer (i.e. the silane monomer having four hydrolyzable groups); when a is 1, the silane monomer having a structure of Formula (I) can be a trifunctional silane monomer (i.e. the silane monomer includes three hydrolyzable groups); when a is 2, the silane monomer having a structure of Formula (I) can be a difunctional silane monomer (i.e. the silane monomer includes two hydrolyzable groups); when a is 3, the silane monomer having a structure of Formula (I) can be a monofunctional silane monomer (i.e. the silane monomer includes one hydrolyzable group). The aforementioned hydrolyzable groups refer to groups that can subject to a hydrolysis reaction and be bonded onto silicon. The hydrolyzable group can be an alkoxyl, an acyloxy, or a phenoxy.

For example, the aforementioned tetrafunctional silane monomer can be tetramethoxy silane, tetraethoxy silane, tetraacetoxy silane, tetraphenoxy silane and the like.

For example, the aforementioned trifunctional silane monomer can be methyltrimethoxy silane (MTMS), methyltriethoxy silane, methyltriisopropoxy silane, methyltri-n-butoxy silane, ethyltrimethoxy silane, ethyltriethoxy silane, ethyltriisopropoxy silane, ethyltri-n-butoxy silane, n-propyltrimethoxy silane, n-propyltriethoxy silane, n-butyltrimethoxy silane, n-butyltriethoxy silane, n-hexyltrimethoxy silane, n-hexyltriethoxy silane, decyltrimethoxy silane, vinyltrimethoxy silane, vinyltriethoxy silane, 3-acryoyloxypropyltrimethoxy silane, 3-methylacryloyloxypropyltrimethoxy silane (MPTMS), 3-methylacryloyloxypropyltriethoxy silane, phenyltrimethoxy silane (PTMS), phenyltriethoxy silane (PTES), p-hydroxyphenyltrimethoxy silane, 1-(p-hydroxyphenyl)ethyltrimethoxy

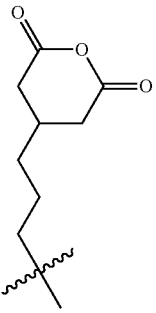

silane, 2-(p-hydroxyphenyl)ethyltrimethoxy silane, 4-hydroxy-5-(p-hydroxyphenylcarbonyloxy)pentyltrimethoxy silane, trifluoromethyltrimethoxy silane, trifluoromethyltriethoxy silane, 3,3,3-trifluoropropyltrimethoxy silane, 3-aminopropyltrimethoxy silane, 3-aminopropyltriethoxy silane, 3-glycidoxypropyltrimethoxy silane, 3-glycidoxypropyltriethoxy silane, 2-(3,4-epoxycyclohexyl)ethyltrimethoxy silane, 3-mercaptopropyltrimethoxy silane, 2-oxetanylbutoxypropyltriphenoxy silane or commercial products, such as: 2-oxetanylbutoxypropyltrimethoxy silane (manufactured by Toagosei Co., Ltd., and the trade name is TMSOX-D), 2-oxetanylbutoxypropyltriethoxysilane (manufactured by Toagosei Co., Ltd., and the trade name is TESOX-D), 3-triphenoxysilyl propyl succinic anhydride (manufactured by Shin-Etsu Chemical Co., Ltd., and the trade name is X-12-967), 3-(triethoxysilyl)propyl succinic anhydride (manufactured by Wacker Chemie AG Co. Ltd., and the trade name is GF-20), 3-(trimethoxysilyl)propyl glutaric anhydride (the trade name is TMSG), 3-(triethoxysilyl)propyl glutaric anhydride, 3-(triphenoxysilyl)propyl glutaric anhydride or the like For example, the aforementioned difunctional silane monomer can be dimethyldimethoxy silane (DMDMS), dimethyldiethoxy silane, dimethyldiacetyloxy silane, di-n-butyldimethoxy silane, diphenyldimethoxy silane, diisopropoxy-di(2-oxetanylbutoxypropyl)silane (DIDOS), di(3-oxetanylpentyl)dimethoxy silane, (di-n-butoxysilyl) di(propyl succinic anhydride), (dimethoxysilyl) di(ethyl succinic anhydride) or the like For example, the aforementioned monofunctional silane monomer can be trimethylmethoxy silane, tri-n-butylethoxy silane, 3-glycidoxypropyldimethylmethoxy silane, 3-glycidoxypropyldimethylethoxy silane, di(2-oxetanylbutoxypentyl)-2-oxetanylpentylethoxy silane, tri(2-oxetanylpentyl) methoxy silane, phenoxysilyltripropyl succinic anhydride, methoxysilyldiethyl succinic anhydride or the like.

The aforementioned silane monomer can be used alone or in a combination of two or more.

When the polysiloxane resin (A) is obtained by polycondensing a silane monomer having a structure of Formula (I), and at least one $Y_1$ represents an alkyl group having an anhydride group, an alkyl group having an epoxy group or an alkoxy group having an epoxy group, the photosensitive resin composition has a better leveling resistance.

The aforementioned polysiloxane prepolymer can include a polysiloxane prepolymer having a structure of Formula (I-4):

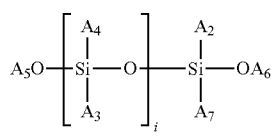

(I-4)

In formula (I-4), $A_1$, $A_2$, $A_3$ and $A_4$ independently represent a hydrogen atom, an alkyl group of 1 to 10 carbons, an alkenyl group of 2 to 6 carbons, or an aromatic group of 6 to 15 carbons. $A_5$ and $A_6$ independently represent a hydrogen atom, an alkyl group of 1 to 6 carbons, an acyl group of 1 to 6 carbons, or an aromatic group of 6 to 15 carbon atoms. i can represent an integer of 1 to 1000.

When the aforementioned $A_1$, $A_2$, $A_3$ and $A_4$ independently represent an alkyl group of 1 to 10 carbons, $A_1$, $A_2$, $A_3$ and $A_4$ can be methyl, ethyl, or n-propyl. When the aforementioned $A_1$, $A_2$, $A_3$ and $A_4$ respectively represent an alkenyl group of 2 to 6 carbons, $A_1$, $A_2$, $A_3$ and $A_4$ can be vinyl, acryloyloxypropyl, or methylacryloyloxypropyl. When the aforementioned $A_1$, $A_2$, $A_3$ and $A_4$ independently represent an aromatic group of 6 to 15 carbons, $A_1$, $A_2$, $A_3$ and $A_4$ can be phenyl, tolyl, or naphthyl. Any of the aforementioned alkyl group, alkenyl group, or aromatic group can optionally have substituents.

When the aforementioned $A_5$ and $A_6$ independently represent an alkyl group of 1 to 6 carbons, $A_5$ and $A_6$ can be methyl, ethyl, n-propyl, isopropyl, or n-butyl. When the aforementioned $A_5$ and $A_6$ independently represent an acyl group of 1 to 6 carbons, $A_5$ and $A_6$ can be vinyl. When the aforementioned $A_5$ and $A_6$ independently represent an aromatic group of 6 to 15 carbons, $A_5$ and $A_6$ can be phenyl. Any of the aforementioned alkyl group, acyl group, or aromatic group can optionally have substituents.

When i is an integer of 2 to 1000, a plurality of $A_1$ can be the same or different, and a plurality of $A_3$ can be the same or different. i preferably can be an integer of 3 to 300, and more preferably is an integer 5 to 200.

For examples, the polysiloxane prepolymer having a structure of Formula (I-4) can include 1,1,3,3-tetramethyl-1,3-diethoxydisiloxane, 1,1,3,3-tetramethyl-1,3-dimethoxydisiloxane, 1,1,3,3-tetraethyl-1,3-diethoxydisiloxane, or silanol terminated polydimethylsiloxane manufactured by Gelest, Inc., and the trade names are DMS-S12 (Molecular weight: 400 to 700), DMS-S15 (Molecular weight: 1500 to 2000), DMS-S21 (Molecular weight: 4200), DMS-S27 (Molecular weight: 18000), DMS-S31 (Molecular weight: 26000), DMS-S32 (Molecular weight: 36000), DMS-S33 (Molecular weight: 43500), DMS-S35 (Molecular weight: 49000), DMS-S38 (Molecular weight: 58000), DMS-S42 (Molecular weight: 77000), or PDS-9931 (Molecular weight: 1000 to 1400).

The aforementioned polysiloxane prepolymer having a structure of formula (I-4) can be used alone or in a combination of two or more.

The aforementioned silane monomer and polysiloxane prepolymer can be used in combination, and there is no particular limitation in a combining ratio. Preferably, a molar ratio of silicon atoms of the silane monomer to the polysiloxane prepolymer is 100:0.01 to 50:50.

Moreover, the aforementioned mixture can optionally include silicon dioxide particles. There is no particular limitation in an average particle size of the silicon dioxide particles. The average particle size can be 2 nm to 250 nm, preferably is 5 nm to 200 nm, and more preferably is 10 nm to 100 nm.

For example, the aforementioned silicon dioxide particles can be commercial products manufactured by JGC C&C Co. Ltd., and the trade names are OSCAL 1132 (particle size is 12 nm, and the dispersant is methanol), OSCAL 1332 (particle size is 12 nm, and the dispersant is n-propanol), OSCAL 105 (particle size is 60 nm, and the dispersant is γ-butyrolactone), OSCAL 106 (particle size is 120 nm, and the dispersant is diacetone alcohol) or the like; commercial products manufactured by Fuso Chemical Co. LTD., and the trade names are Quartron PL-1-IPA (particle size is 13 nm, and the dispersant is isopropyl ketone), Quartron PL-1-TOL (particle size is 13 nm, and the dispersant is toluene), Quartron PL-2L-PGME (particle size is 18 nm, and the dispersant is propylene glycol monomethyl ether), Quartron PL-2L-MEK (particle size is 18 nm, and the dispersant is methyl ethyl ketone) or the like; commercial products manufactured by Nissan Chemical Industries Co. LTD., and the trade names are IPA-ST (particle size is 12 nm, and the dispersant is isopropanol), EG-ST (particle size is 12 nm, and the dispersant is ethylene glycol), IPA-ST-L (particle size is 45 nm, and the dispersant is isopropanol), IPA-ST-ZL (particle size is 100 nm, and the dispersant is isopropanol) or the like. The aforementioned silicon dioxide particles can be used alone or in a combination of two or more.

The aforementioned silicon dioxide particles can be used in combination of the silane monomer and/or the polysiloxane prepolymer, and there is no particular limitation in the combining ratio. Preferably, the molar ratio of silicon atoms in the silicon dioxide particles and the polysiloxane prepolymer is 1% to 50%.

In the aforementioned polymerization reaction [i.e. hydrolysis reaction and partially condensation], the mixture is first added into the solvent and water. The mixture can include the silane monomer, polysiloxane prepolymer and/or silicon dioxide particles, and the mixture can optionally include catalyst. Then, the solution is stirred at 50° C. to 150° C. After 0.5 hours to 120 hours, byproducts (such as alcohols, water or the like) were removed by distillation.

There is no particular limitation in the solvent of the aforementioned polymerization reaction, and the solvent can be the same as or different from the following solvent (D) of the present invention. Based on the total amount of the silane monomer, the polysiloxane prepolymer, and/or the silicon dioxide particles as 100 g, an amount of the solvent is 15 g to 1200 g, preferably is 20 g to 1100 g, and more preferably is 30 g to 1000 g.

Based on the total amount of the hydrolyzable groups in the silane monomer, the polysiloxane prepolymer, and/or the silicon dioxide particles as 1 mole, the water used in the aforementioned polymerization reaction (i.e. the water used for hydrolysis) is 0.5 mole to 2 mole.

There is no particular limitation in the aforementioned catalyst, and the catalyst is preferably selected from acidic catalysts or basic catalysts. The acidic catalyst can include hydrochloric acid, nitric acid, sulfuric acid, hydrofluoric acid, oxalic acid, phosphoric acid, acetic acid, trifluoroacetic acid, formic acid, polybasic carboxylic acid, the acid anhydride thereof, ion-exchange resin or the like. The basic catalyst can include diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilane having an amine group and an alkoxy group, ion-exchange resin or the like.

Based on the total amount of the silane monomer, the polysiloxane prepolymer and/or the silicon dioxide particle as 100 g, an amount of the catalyst is 0.005 g to 15 g, preferably is 0.01 g to 12 g, and more preferably is 0.05 g to 10 g.

In view of the stability, the polysiloxane resin (A) preferably does not include byproducts (such as alcohol or water) and catalysts. Therefore, the mixture can be optionally subjected to purification after the polymerization reaction, so as to obtain the polysiloxane resin (A). There is no particular limitation in the method for purification. Preferably, the purification is performed by diluting the mixture with a hydrophobic solvent to form a mixture solution. Then, the mixture solution is transferred into a separation funnel. And then, an organic layer in the separation funnel is extracted by water for several times, and the organic layer is concentrated by a rotary evaporator to remove alcohol or water. Besides, the catalyst can be removed by an ion-exchange resin.

If the photosensitive resin composition of the present invention does not include the polysiloxane resin (A), the photosensitive resin composition would have a defect of a poor leveling resistance.

Alkali-Soluble Resin (B)

The alkali-soluble resin (B) of the present invention refers to a resin that can be soluble in an alkaline aqueous solution without being limited to any specific structure.

Preferably, the alkali-soluble resin (B) refers to a resin including a carboxylic group or a phenol-novolac resin. More preferably, the alkali-soluble resin (B) is copolymerized by a reacting mixture in the presence of a polymerization initiator. The mixture includes an unsaturated carboxylic acid or unsaturated carboxylic anhydride compound (b1), a fluorene derivative having a double-bond group (b2) and an unsaturated compound having an acid-decomposable group (b3).

In one embodiment, the aforementioned mixture can optionally include an unsaturated compound having an epoxy group (b4) and an other unsaturated compound (b5).

Unsaturated Carboxylic Acid or Unsaturated Carboxylic Anhydride Compound (b1)

The unsaturated carboxylic acid or unsaturated carboxylic anhydride compound (b1) refers to a compound containing the structure of carboxylic acid or carboxylic anhydride and unsaturated polymerizable bonds without being limited to any specific structure. For example, the unsaturated carboxylic acid or unsaturated carboxylic anhydride compound (b1) can include but be not limited to unsaturated monocarboxylic acid compound, unsaturated dicarboxylic acid compound, unsaturated carboxylic anhydride compound, unsaturated polycyclic carboxylic acid compound, unsaturated polycyclic dicarboxylic acid compound and unsaturated polycyclic acid anhydride compound.

The unsaturated monocarboxylic acid compound can include but be not limited to (meth)acrylic acid, butenoic acid, α-chloracrylic acid, ethyl acrylate, cinnamic acid, 2-(meth)acryloyloxyethyl succinate monoester, 2-(meth)acryloyloxyethyl hexahydrophthalic acid ester, 2-(meth)acryloyloxyethyl phthalic acid ester, omega-carboxyl polycaprolactone polyol monoacrylate (product manufactured by Toagosei Co., Ltd., and the trade name is ARONIX M-5300) or the like.

The unsaturated dicarboxylic acid compound can include but be not limited to maleic acid, fumaric acid, mesaconic acid, itaconic acid, traconic acid or the like.

The unsaturated carboxylic anhydride compound can include but be not limited to the acid anhydride compound of the aforementioned unsaturated dicarboxylic acid compound.

The unsaturated polycyclic carboxylic acid compound can include but be not limited to 5-carboxyl bicyclo[2.2.1]hept-2-ene, 5-carboxyl-5-methylbicyclo[2.2.1]hept-2-ene, 5-carboxyl-5-ethylbicyclo[2.2.1]hept-2-ene, 5-carboxyl-6-methylbicyclo[2.2.1]hept-2-ene, 5-carboxyl-6-ethylbicyclo[2.2.1]hept-2-ene or the like.

The unsaturated polycyclic dicarboxylic acid compound can include but be not limited to 5,6-dicarboxylic bicyclo[2.2.1]hept-2-ene.

The unsaturated polycyclic dicarboxylic anhydride compound can include but be not limited to the anhydride compound of the aforementioned unsaturated polycyclic dicarboxylic acid compound.

Preferably, the unsaturated carboxylic acid or unsaturated carboxylic anhydride compound (b1) is selected from acrylic acid, methacrylic acid, maleic anhydride, 2-methacryloyloxyethyl succinate monoester or 2-methacryloyloxyethyl hexahydrophthalic acid. The aforementioned unsaturated carboxylic acid or unsaturated carboxylic anhydride compound (b1) can be used alone or in a combination two or more.

Based on an total amount of the unsaturated carboxylic acid or unsaturated carboxylic anhydride compound (b1) and the following fluorene derivative having a double-bond group (b2) and the unsaturated compound having an acid-decomposable group (b3) as 100 parts by weight, an amount of the unsaturated carboxylic acid or unsaturated carboxylic anhydride compound (b1) is 5 parts by weight to 29 parts by weight, preferably is 5 parts by weight to 25 parts by weight, and more preferably is 8 parts by weight to 25 parts by weight.

Fluorene Derivative Having Double-Bond Group (b2)

The fluorene derivative having a double-bond group (b2) includes a fluorene derivative having at least one double-bond group. The double-bond group includes alkenyl (such as ethene, propene or the like) or a group having double-bond (such as acrylic ester).

The fluorene derivative having a double-bond group (b2) has a structure shown as following Formula (II):

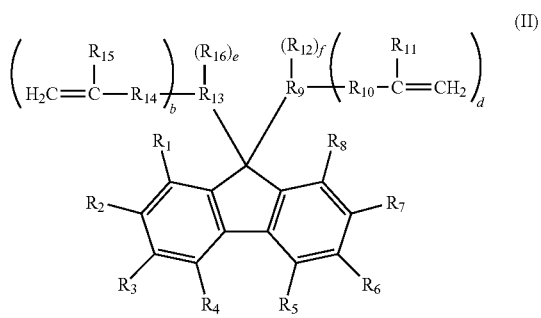

(II)

in Formula (I), $R_1$ to $R_8$ can be the same or different, and $R_1$ to $R_8$ respectively represent a hydrogen atom, a halogen atom, a cyano group and an alkyl group. $R_9$ and $R_{13}$ can be the same or different, and $R_9$ and $R_{13}$ respectively represent an aromatic group or a heterocyclic group. $R_{10}$ and $R_{14}$ can be the same or different, and $R_{10}$ and $R_{14}$ respectively represent a single bond or an organic group. $R_{11}$ and $R_{15}$ can be the same or different, and $R_{11}$ and $R_{15}$ respectively represent a hydrogen atom or a methyl group. $R_{12}$ and the $R_{16}$ can be the same or different, and the $R_{12}$ and the $R_{16}$ respectively represent a hydrogen atom, a halogen atom, an alkyl group, a cycloalkyl group, an aromatic group, an alkyl aromatic group, an alkoxy group, a cycloalkyloxy group, an aroxyl group, an acyl group, a nitro group, a cyano group or an amine group. b and d respectively represent an integer of 1 to 3; and e and f respectively represent an integer of 0 to 3.

In $R_1$ to $R_8$, the aforementioned halogen atom can include but be not limited to fluorine, chloride or the like. The alkyl group represents an alkyl group of 1 to 8 carbons. The alkyl group can represent a linear alkyl group or a branched alkyl group, and the alkyl group of 1 to 8 carbons can include but be not limited to methyl, ethyl or the like.

In $R_9$ and $R_{13}$, the aforementioned aromatic group represents an aromatic group of 6 to 14 carbons, and the aromatic group of 6 to 14 carbons can include but be not limited to phenyl, naphthyl, anthryl, biphenylyl, indenyl or the like. Preferably, the aromatic group of 6 to 14 carbons is selected from phenyl, naphthyl or the like.

In $R_{10}$ and $R_{14}$, the organic group can include but be not limited to ester, a combination of ester and ether, silyl ether, amine formyl ester, or a combination of amine formyl ester and ether. The organic group is (i) ester synthesized with a fluorene derivative having $R_9$ and $R_{13}$ of hydroxy-substituted or glycidyl-substituted and a (meth)acrylic compound having at least one carboxylic group or the fluorene derivative having $R_9$ and $R_{13}$ of hydroxy-substituted or glycidyl-substituted and a anhydride compound having at least one anhydride group; (ii) ester synthesized with a fluorene derivative having $R_9$ and $R_{13}$ of carboxylic-substituted and a hydroxy alkyl (meth)acrylate or the fluorene derivative having $R_9$ and $R_{13}$ of carboxylic-substituted and glycidyl (meth)acrylate; (iii) amine formyl ester synthesized with a fluorene derivate having $R_9$ and $R_{13}$ of hydroxy-substituted or glycidyl-substituted and a (meth)acrylate compound having a terminal of isocyanate group.

The aforementioned (meth)acrylic compound having at least one carboxylic group can include but be not limited to (meth)acrylic acid. The aforementioned anhydride compound having at least one anhydride group can include but be not limited to maleic anhydride. The aforementioned (meth)acrylate compound having a terminal of isocyanate group is synthesized with hydroxy alkyl (meth)acrylate and diisocyanate or hydroxy alkyl (meth)acrylate, diisocyanate and diol.

The (meth)acrylate compound having a terminal of isocyanate group can include but be not limited to (meth)acryloyloxy alkyl isocyanate or (meth)acryloyloxy phenyl isocyanate. The (meth)acryloyloxy alkyl isocyanate can include but be not limited to 2-(meth)acryloyloxy ethyl isocyanate, 6-(meth)acryloyloxy hexyl isocyanate, 2,2-bis(meth)acryloyloxymethyl ethyl isocyanate or the like. The (meth)acryloyloxy phenyl isocyanate can include but be not limited to 4-(meth)acryloyloxy phenyl isocyanate or the like.

Besides, the organic group can be silyl ether synthesized with the fluorene derivate having $R_9$ and $R_{13}$ of hydroxy-substituted and silane coupling agent having ethylenically unsaturated group or (meth)acryloyloxy group.

There is no particular limitation in substituted site where $R_{10}$ and $R_{14}$ boned onto $R_9$ and $R_{13}$. Preferably, when $R_9$ and $R_{13}$ are benzene, $R_{10}$ and $R_{14}$ can be bonded onto C3 or C4 position. When $R_9$ and $R_{13}$ are naphthalene, $R_{10}$ and $R_{14}$ can be bonded onto C4, C5, C6 or C7 position.

In $R_{12}$ and $R_{16}$, the aforementioned halogen atom can include but be not limited to fluorine, chloride or the like. The aforementioned alkyl group can represent an alkyl group of 1 to 8 carbons. The alkyl group can represent a linear alkyl group or a branched alkyl group, and the alkyl group of 1 to 8 carbons can include but be not limited to methyl, ethyl, propyl, iso-propyl, butyl, tert-butyl, iso-butyl or the like. The aforementioned cycloalkyl group represents a cycloalkyl group of 5 to 10 carons, and the cycloalkyl group of 5 to 10 carbons can include but be not limited to cyclopentyl, cyclohexyl or the like. The aforementioned aromatic group represents an aromatic group of 6 to 10 carbons, and the aromatic group of 6 to 10 carbons can include but be not limited to phenyl, naphthyl or the like. The aforementioned alkyl aromatic group represents a combination of an alkyl of 1 to 4 carbons and an aromatic group of 6 to 10 carbons, and the alkyl aromatic group can include but be not limited to benzyl, ethyl phenyl, tolyl, xylyl or tert-butyl phenyl. The aforementioned alkoxy group represents an alkoxy group of 1 to carbons, and the alkoxy group of 1 to 8 carbons can include but be not limited to methoxy, ethoxy, propoxy, butoxy, tert-butoxy, iso-butoxy or the like. The aforementioned cycloalkyloxy group represents a cycloalkyloxy group of 5 to 10 carbons, and the cycloalkyloxy group of 5 to 10 carbons can include but be not limited to cyclohexyloxy or the like. The aforementioned aroxyl group represents an aroxyl group of 6 to 10 carbons, and the aroxyl group of 6 to 10 carbons can include but be not limited to phenoxy or the like. The aforementioned acyl group represents an acyl group of 1 to 6 carbons, and the acyl group of 1 to 6 carbons can include but be not limited to acetyl. The aforementioned amine group can include but be not limited to —$NH_2$ or an amine group having substituted group, and the amine group having substituted group can include but be not limited to alkyl amine of 1 to 6 carbons or the like.

There is no particular limitation in substituted site where $R_{12}$ and $R_{16}$ boned onto $R_9$ and $R_{13}$. Preferably, when $R_9$ and $R_{13}$ are benzene, $R_{12}$ and $R_{16}$ can be bonded onto C2, C3 or C4 position. When $R_9$ and $R_{13}$ are naphthalene, $R_{12}$ and $R_{16}$ can be bonded onto C4, C5, C6 or C7 position.

Preferably, $R_{12}$ and $R_{16}$ can be the same or different, and $R_{12}$ and $R_{16}$ respectively represent an alkyl group of 1 to 4 carbons, a phenyl group, an alkoxy group of 1 to 4 carbons. More preferably, $R_{12}$ and $R_{16}$ can be the same or different, and $R_{12}$ and $R_{16}$ respectively represent methyl, ethyl, phenyl, methoxy and ethoxy. Preferably, b and d respectively represent an integer of 1 to 2, and e and f respectively represent an integer of 0 to 1.

The fluorene derivative having a double-bond group (b2) has a structure shown as following Formula (III):

The definition of $R_1$ to $R_8$ is the same as the definition of the aforementioned $R_1$ to $R_8$ of Formula (II) rather than focusing or mentioning them in details.

In the definition of $R_{17}$ and $R_{18}$, the divalent alkyl group represents a divalent alkyl group of 2 to 6 carbons or a hydroxyl-substituted divalent alkyl group. The divalent alkyl group can represent a linear alkyl group or a branched alkyl group, and the divalent alkyl group can include but be not limited to ethylene, propylene, trimethylene, tetramethylene or the like. The hydroxyl-substituted divalent alkyl group can include but be not limited to 2-hydroxy-trimethylene or the like. Preferably, the divalent alkyl group is a linear divalent alkyl group of 2 to 4 carbons or a branched divalent alkyl group of 3 to 6 carbons. g and h preferably represent an integer of 1 to 7, and more preferably represent an integer of 1 to 5.

The fluorene derivative having a double-bond group (b2) can include but be not limited to 9,9'-bis{[(meth)acryloyloxy]phenyl}fluorene compound, 9,9'-bis{[(meth)acryloyloxyalkoxy]phenyl}fluorene compound, 9,9'-bis{monoalkyl [2-(meth)acryloyloxyalkoxy]phenyl}fluorene compound, 9,9'-bis{dialkyl-[2-(meth)acryloyloxyalkoxy] phenyl}fluorene compound, 9,9'-bis{di[2-(meth)acryloyloxyalkoxy]phenyl}fluorene compound, 9,9'-bis{tri[2-(meth)acryloyloxyalkoxy]phenyl}fluorene compound, 9,9'-bis{[phenyl-(meth)acryloyloxyalkoxy]phenyl}fluorene compound or 9,9'-bis{[(meth)acryloyloxy] naphthyl}fluorene compound. The fluorene derivative having a double-bond group (b2) can be used alone or in a combination two or more.

The 9,9'-bis{[(meth)acryloyloxy]phenyl}fluorene compound can include but be not limited to 9,9'-bis{[4-(meth) acryloyloxy]phenyl}fluorene.

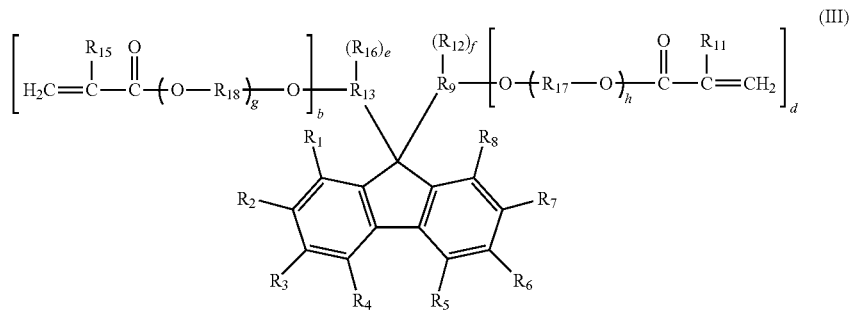

in Formula (III), $R_1$ to $R_8$ are the same or different, and $R_1$ to $R_8$ respectively represent a hydrogen atom, a halogen atom, a cyano group and an alkyl group. $R_9$ and the $R_{13}$ can be the same or different, and $R_9$ and $R_{13}$ respectively represent an aromatic group or a heterocyclic group. $R_{17}$ and $R_{18}$ are a divalent alkyl group or a hydroxyl-substituted divalent alkyl group. $R_{11}$ and $R_{15}$ are the same or different, and $R_{11}$ and $R_{15}$ respectively represent a hydrogen atom or a methyl group. $R_{12}$ and $R_{16}$ are the same or different, and $R_{12}$ and $R_{16}$ respectively represent a hydrogen atom, a halogen atom, an alkyl group, a cycloalkyl group, an aromatic group, an alkyl aromatic group, an alkoxy group, a cycloalkyloxy group, an aroxyl group, an acyl group, a nitro group, a cyano group or an amine group. b and d respectively represent an integer of 1 to 3; e and f respectively represent an integer of 0 to 3; and g and h respectively represent an integer of 0 to 10.

The 9,9'-bis{[(meth)acryloyloxyalkoxy]phenyl}fluorene compound can include but be not limited to 9,9'-bis{4-[2-hydroxy-3-(meth)acryloxypropoxy]phenyl}fluorene, 9,9'-bis{4-[2-(meth)acryloxyethoxy]phenyl}fluorene, 9,9'-bis{4-[2-[2-(meth)acryloxyethoxy]ethoxy]phenyl}fluorene or 9,9'-bis{4-[2-(meth)acryloxypropoxy]phenyl}fluorene.

The 9,9'-bis{monoalkyl-[2-(meth)acryloyloxyalkoxy] phenyl}fluorene compound can include but be not limited to 9,9'-bis{3-methyl-4-[2-(meth)acryloxyethoxy] phenyl}fluorene, 9,9'-bis{3-methyl-4-[2-(meth)acryloxypropoxy]phenyl}fluorene or the like.

The 9,9'-bis{dialkyl-[2-(meth)acryloyloxyalkoxy] phenyl}fluorene compound can include but be not limited to 9,9'-bis{3,5-dimethyl-4-[2-(meth)acryloxyethoxy] phenyl}fluorene, 9,9'-bis{3,5-dimethyl-4-[2-[2-(meth)acryloxyethoxy]ethoxy]phenyl}fluorene or the like.

The 9,9'-bis{di[2-(meth)acryloyloxyalkoxy]phenyl}fluorene compound can include but be not limited to 9,9'-bis{3,5-di[2-(meth)acryloxyethoxy]phenyl}fluorene or the like.

The 9,9'-bis{tri[2-(meth)acryloyloxyalkoxy]phenyl}fluorene compound can include but be not limited to 9,9'-bis{3,4,5-tri[2-(meth)acryloxyethoxy]phenyl}fluorene or the like.

The 9,9'-bis{[phenyl-(meth)acryloyloxyalkoxy]phenyl}fluorene compound can include but be not limited to 9,9'-bis{3-phenyl-4-[2-(meth)acryloxyethoxy]phenyl}fluorene or the like.

The 9,9'-bis{[(meth)acryloyloxy]naphthyl}fluorene compound can include but be not limited to 9,9'-bis{6-[2-(meth)acryloxyethoxy]-2-nathphyl}fluorene, 9,9'-bis{6-[2-(meth)acryloxyethoxy]-1-nathphyl}fluorene, 9,9'-bis{5-[2-(meth)acryloxyethoxy]-2-nathphyl}fluorene, 9,9'-bis{5-[2-(meth)acryloxyethoxy]-1-nathphyl}fluorene or the like.

The fluorene derivative having a double-bond group (b2) preferably can be 9,9'-bis[4-(2-methacryloyloxy)phenyl]fluorene, 9,9'-bis[3-methyl-4-(2-acryloxypropoxy)phenyl]fluorene, 9,9'-bis[3-phenyl-4-(2-methacryloxyethoxy)phenyl]fluorene and 9,9'-bis[4-(2-hydroxy-3-acryloxypropoxy)phenyl]fluorene.

The fluorene derivative having a double-bond group (b2) can be commercial products manufactured by Osaka Gas Co., LTD., and the trade names are OGSOL series EA-0200, EA-0500, EA-1000, EA-F5003, EA-F5503 or EA-F5510, or commercial products manufactured by Shin-Nakamura Chemical Co., LTD., and the trade name is A-BPEF. The aforementioned fluorene derivative having a double-bond group (b2) can be used alone or in a combination two or more.

Based on an total amount of the unsaturated carboxylic acid or unsaturated carboxylic anhydride compound (b1) and the fluorene derivative having a double-bond group (b2) and the following unsaturated compound having an acid-decomposable group (b3) as 100 parts by weight, an amount of the fluorene derivative having a double-bond group (b2) is 15 parts by weight to 70 parts by weight, preferably is 20 parts by weight to 70 parts by weight, and more preferably is 30 parts by weight to 70 parts by weight.

When the alkali-soluble resin (B) does not include the fluorene derivative having a double-bond group (b2), the photosensitive resin composition has defects of poor resistance to development and poor leveling resistance.

Unsaturated Compound Having Acid-Decomposable Group (b3)

The unsaturated compound having an acid-decomposable group (b3) of the alkali-soluble resin (B) has a following structure shown as Formula (IV):

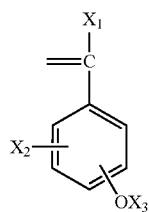

(IV)

in the Formula (IV), $X_1$ represents a hydrogen atom or an alkyl group of 1 to 3 carbons. $X_2$ represents a hydrogen atom, an alkyl group of 1 to 30 carbons or an aromatic group of 6 to 30 carbons. The alkyl group can represent a linear alkyl group, a branched alkyl group or a cycloalkyl group. $X_3$ represents a hydrogen atom, an alkyl group of 1 to 40 carbons, a trialkyl silane group or an oxoalkyl group. The alkyl group can represent a linear alkyl group, a branched alkyl group or a cycloalkyl alkyl group. Each alkyl group of the trialkyl silane group has 1 to 6 carbons, and each alkyl group of the oxoalkyl group has 4 to 20 carbons. $X_3$ can have a following structure shown as Formula (V):

(V)

in the Formula (V), $X_4$ represent a hydrogen atom or an alkyl group of 1 to 10 carbons. The alkyl group can represent a linear alkyl group, a branched alkyl group or a cycloalkyl group. $X_5$ and $X_6$ respectively represent a hydrogen atom or an alkyl group of 1 to 10 carbons. The alkyl group can represent a linear alkyl group, a branched alkyl group or a cycloalkyl group. When $X_5$ and $X_6$ represent the linear alkyl group or the branched alkyl group, $X_5$ and $X_6$ can be boned to form a ring structure The aforementioned $X_1$ preferably can be a hydrogen atom or a methyl group.

The aforementioned $X_2$ preferably can be an alkyl group of 1 to 20 carbons or an aromatic group of 6 to 20 carbons. More preferably, $X_2$ can be an alkyl group of 1 to 10 carbons or an aromatic group of 6 to 10 carbons.

For example, in $X_2$, the alkyl group can be methyl, ethyl, propyl, iso-propyl, butyl, iso-butyl, tert-butyl, cyclohexyl or the like, and the aromatic group can be phenyl, 4-tolyl, naphthyl or the like. Preferably, $X_2$ can be methyl, ethyl or phenyl.

The aforementioned $X_3$ preferably can be an alkyl group of 1 to 30 carbons, and more preferably can be an alkyl group of 1 to 20 carbons. When $X_3$ represents the trialkyl silane group, each alkyl group of the trialkyl silane group preferably has 1 to 4 carbons. When $X_3$ represents the oxoalkyl group, each alkyl group of the oxoalkyl group preferably has 4 to 10 carbons.

For example, in $X_3$, the aforementioned alkyl group can include methyl, ethyl, propyl, iso-propyl, butyl, iso-butyl, tert-butyl, cyclopentyl, cyclohexyl, cycloheptyl, triethylcarbaryl, 1-ethylnorbornyl, 1-methylcyclohexyl, adamantly, 2-(2-methyl)adamantly, tert-pentyl or the like. The aforementioned trialkyl silane group can be trimethyl silane, triethyl silane, dimethyl-tert-butyl silane or the like. The oxoalkyl group can be 3-oxocyclohexyl or the like.

The aforementioned $X_4$ preferably can be an alkyl group of 1 to 8 carbons, and more preferably can be an alkyl group of 1 to 6 carbons.

The aforementioned $X_5$ and $X_6$ preferably can be an alkyl group of 1 to 8 carbons, and more preferably can be an alkyl group of 1 to 6 carbons.

The structure shown as Formula (V) can be linear alkyl or branched acetal, such as 1-methoxyethyl, 1-ethoxyethyl, 1-n-propoxy, 1-iso-propoxy, 1-n-butoxy, 1-iso-butoxy, 1-sec-butoxy, 1-tert-butoxy, 1-tert-amyloxyethyl, 1-ethoxy-n-propyl, 1-cyclohexyloxyethyl, methoxypropyl, ethoxypropyl, 1-methoxy-1-methylethyl, 1-ethoxy-1-methylethyl or the like; cyclo acetal, such as tetrahydrofuryl, tetrahydropyranyl or the like. The structure shown as Formula (V) preferably can be ethoxyethyl, butoxy, ethoxypropyl or tetrahydrofuryl.

Preferably, in the structure shown as Formula (IV), $X_1$ represents a hydrogen atom or a methyl group; $X_2$ represents a hydrogen atom or an alkyl group of 1 to 6 carbons, and the alkyl group can be a linear alkyl group or a branched alkyl group; $X_3$ represents a hydrogen atom, an alkyl group of 1 to 12 carbons, trialkyl silane group of 3 to 18 carbons or the structure shown as Formula (V), and the alkyl group can be a linear alkyl group, a branched alkyl group or a cycloalkyl group. In Formula (V), $X_4$ represents an alkyl group of 1 to 6 carbons, and the alkyl group can be a linear alkyl group, a branched alkyl group or a cycloalkyl group; $X_5$ and $X_6$ respectively represents a hydrogen atom or an alkyl group of 1 to 6 carbons, and the alkyl group can be a linear alkyl group, a branched alkyl group or a cycloalkyl group, or $X_5$ and $X_6$ can be boned to form a ring structure.

For example, the structure shown as Formula (IV) can be hydroxystyrene, α-methyl hydroxystyrene, methoxystyrene, tert-butoxystyrene, cyclohexyloxystyrene, trimethoxysilylstyrene, 4-(1-methoxyethoxy)styrene, 4-(1-ethoxyethoxy) styrene, tetrahydropyranyloxy styrene or the like. The structure shown as Formula (IV) preferably can be hydroxystyrene, methoxystyrene, tert-butoxystyrene, 4-(1-ethoxyethoxy)styrene or tetrahydropyranyloxy styrene.

Based on an total amount of the unsaturated carboxylic acid or unsaturated carboxylic anhydride compound (b1), the fluorene derivative having a double-bond group (b2) and the unsaturated compound having an acid-decomposable group (b3) as 100 parts by weight, an amount of the unsaturated compound having an acid-decomposable group (b3) is 1 part by weight to 80 parts by weight, preferably is 5 parts by weight to 75 parts by weight, and more preferably is 5 parts by weight to 62 parts by weight.

When the alkyl-soluble resin (B) does not include the unsaturated compound having an acid-decomposable group (b3), the photosensitive resin composition has defects of poor resistance to development and poor leveling resistance.

Unsaturated Compound Having Epoxy Group (b4)

In the alkali-soluble resin (B) of the present invention, the aforementioned reacting mixture can optionally include a copolymerizable monomer of the unsaturated compound having an epoxy group (b4). The unsaturated compound having an epoxy group (b4) can include but be not limited to (meth)acrylic ester compound having an epoxy group, α-alkyl acrylate compound having an epoxy group or epoxypropyl ether compound.

The (meth)acrylic ester compound having an epoxy group can include but be not limited to glycidyl (meth)acrylate, 2-methylglycidyl (meth)acrylate, 3,4-epoxybutyl (meth) acrylate, 6,7-epoxyheptyl (meth)acrylate, 3,4-epoxycyclohexyl (meth)acrylate, 3,4-epoxycyclohexylmethyl (meth) acrylate or the like.

The α-alkyl acrylate compound having an epoxy group can include but be not limited to glycidyl α-ethacrylate, glycidyl α-n-propylacrylate, glycidyl α-n-butylacrylate, 6,7-epoxyheptyl α-ethacrylate or the like.

The epoxypropyl ether compound can include but be limited to o-vinylbenzylglycidylether, m-vinylbenzylglycidylether, p-vinylbenzylglycidylether or the like.

The unsaturated compound having an epoxy group (b4) is preferably selected from glycidyl methacylate, 3,4-epoxycyclohexylmethyl (meth)acrylate, 6,7-epoxyheptyl acrylate, o-vinylbenzylglycidylether, m-vinylbenzylglycidylether and p-vinylbenzylglycidylether. The aforementioned unsaturated compound having an epoxy group (b4) can be used alone or in a combination two or more.

Based on an total amount of the unsaturated carboxylic acid or unsaturated carboxylic anhydride compound (b1), the fluorene derivative having a double-bond group (b2) and the unsaturated compound having an acid-decomposable group (b3) as 100 parts by weight, an amount of the unsaturated compound having an epoxy group (b4) is 0 parts by weight to 50 parts by weight, preferably is 1 part by weight to 40 parts by weight, and more preferably is 2 parts by weight to 30 parts by weight.

When the alkali-soluble resin (B) of the present invention includes the unsaturated compound having an epoxy group (b4), the photosensitive resin composition has better leveling resistance and resistance to development.

Other Unsaturated Compound (b5)

In the alkali-soluble resin composition (B) of the present invention, the aforementioned reacting mixture can optionally include the other unsaturated compound (b5). The other unsaturated compound (b5) can include but be not limited to alkyl (meth)acrylate, alicyclic (meth)acrylate, aryl (meth) acrylate, unsaturated dicarboxylic diester, hydroxyalkyl (meth)acrylate, polyether of (meth)acrylic ester, aromatic vinyl compound and other unsaturated monomer.

The alkyl (meth)acrylate can include but be not limited to methyl (meth)acrylate, ethyl (meth)acrylate, n-propyl (meth)acrylate, isopropyl (meth)acrylate, n-butyl (meth) acrylate, iso-butyl (meth)acrylate, sec-butyl (meth)acrylate, tert-butyl (meth)acrylate or the like.

The alicyclic (meth)acrylate can include but be not limited to cyclohexyl (meth)acrylate, 2-methylcyclohexyl (meth)acrylate, tricyclic[5.2.1.0$^{2,6}$]deca-8-yl (meth)acrylic ester (or referred to as dicyclopentanyl (meth)acrylate), dicyclopentyloxyethyl (meth)acrylate, isobornyl (meth) acrylate, tetrahydrofuranyl (meth)acrylate or the like.

The aryl (meth)acrylate can include but be not limited to phenyl (meth)acrylate, benzyl (meth)acrylate or the like.

The unsaturated dicarboxylic diester can include but not limited to diethyl maleate, diethyl fumarate, diethyl itaconate or the like.

The hydroxyalkyl (meth)acrylate can include but not limited to 2-hydroxyethyl (meth)acrylate, 2-hydroxypropyl (meth)acrylate or the like.

The polyether of (meth)acrylic ester can include but not limited to polyglycol mono(meth)acrylate, polypropylene glycol mono(meth)acrylate or the like.

The aromatic vinyl compound can include but not limited to styrene monomer, α-methylstyrene, m-methylstyrene, p-methylstyrene, p-methoxy styrene or the like.

The other unsaturated monomer can include but not limited to acrylonitrile, methacrylonitrile, chloroethylene, vinylidene chloride, acrylamide, methacrylamide, vinyl acetate, 1,3-butadiene, isoprene, 2,3-dimethyl 1,3-butadiene, N-cyclohexyl maleimide, N-phenyl maleimide, N-benzyl maleimide, N-succinimide-3-maleimidobenzoic ester, N-succimide-4-maleimidobutyric ester, N-succinimide-6-maleimidocaproate, N-succinimide-3-maleimido propionic ester, N-(9-acridinyl) maleimide or the like.

The other unsaturated compound (b5) is preferably selected from methyl (meth)acrylate, butyl (meth)acrylate, 2-hydroxyethyl (meth)acrylate, tert-butyl (meth)acrylate, benzyl (meth)acrylate, dicyclopentanyl (meth)acrylate, dicyclopentyloxyethyl (meth)acrylate, styrene or p-methoxy styrene. The aforementioned other unsaturated compound (b5) can be used alone or in a combination two or more.

Based on an total amount of the unsaturated carboxylic acid or unsaturated carboxylic anhydride compound (b1), the fluorene derivative having a double-bond group (b2) and the unsaturated compound having an acid-decomposable group (b3) as 100 parts by weight, an amount of the other unsaturated compound (b5) is 0 parts by weight to 50 parts by weight, preferably is 1 part by weight to 40 parts by weight, and more preferably is 2 parts by weight to 30 parts by weight.

Method for Producing Alkali-Soluble Resin (B)

During manufacturing, the alkali-soluble resin (B) is obtained by subjecting the unsaturated carboxylic acid or unsaturated carboxylic anhydride compound (b1), the fluorene derivative having a double-bond group (b2) and the unsaturated compound having an acid-decomposable group (b3) to a copolymerization reaction. Moreover, the unsaturated compound having an epoxy group (b4) and the other unsaturated compound (b5) can optionally added into the copolymerization reaction.

The solvent used for manufacturing the alkali-soluble resin (B) can include but be not limited to (1) alcohol: methanol, ethanol, phenylcarbinol, 2-phenylethanol, 3-phenyl-1-propanol or the like; (2) ether: tetrahydrofuran or the like; (3) glycol ether: ethylene glycol monopropyl ether, ethylene glycol monomethyl ether, ethylene glycol monoethyl ether or the like; (4) glycolalkyl ether acetate: glycolmonobutyl ether acetate, glycol ether acetate, glycol monomethyl ether acetate or the like; (5) diethylene glycol: diethylene glycol monomethyl ether, diethylene glycol monoethyl ether, diethylene glycol monobutyl ether, diethylene glycol dimethyl ether, diethylene glycol diethyl ether, diethylene glycol ethyl methyl ether or the like; (6) dipropylene glycol: dipropylene glycol monomethyl ether, dipropylene glycol monoethyl ether, dipropylene glycol dimethyl ether, dipropylene glycol diethyl ether, dipropylene glycol ethyl methyl ether or the like; (7) propylene glycol monoalkyl ether: propylene glycol monomethyl ether, propylene glycol monoethyl ether, propylene glycol monopropyl ether, propylene glycol monobutyl ether or the like; (8) propylene glycol monoalkyl ether acetate: propylene glycol monomethyl ether acetate, propylene glycol ethyl ether acetate, propylene glycol propyl ether acetate, propylene glycol butyl ether acetate or the like; (9) propylene glycol monoalkyl ether propionate: propylene glycol monomethyl ether propionate, propylene glycol ethyl ether propionate, propylene glycol propyl ether propionate, propylene glycol butyl ether propionate or the like; (10) aromatic hydrocarbon: methylbenzene, dimethylbenzene or the like; (11) ketone: ethyl methyl ketone, cyclohexanone, diacetone alcohol or the like; (12) ester: methyl acetate, ethyl acetate, propyl acetate, butyl acetate, ethyl 2-hydroxypropionate, methyl 2-hydroxy-2-methpropionate, ethyl 2-hydroxy-2-methpropionate, methyl glycolate, ethyl glycolate, butyl glycolate, methyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methbutyrate, methyl methoxylacetate, ethyl methoxylacetate, butyl methoxylacetate, methyl ethoxylacetate, ethyl ethoxylacetate, propyl ethoxylacetate, butyl ethoxylacetate, methyl propoxylacetate, ethyl propoxylacetate, propyl propoxylacetate, butyl propoxylacetate, methyl butoxyacetate, ethyl butoxyacetate, propyl butoxyacetate, butyl butoxyacetate, 3-methoxylbutyl acetate, methyl 2-methoxyl propionate, ethyl 2-methoxylpropionate, propyl 2-methoxylpropionate, butyl 2-methoxylpropionate, methyl 2-ethoxylpropionate, ethyl 2-ethoxylpropionate, propyl 2-ethoxylpropionate, butyl 2-ethoxylpropionate, methyl 2-butoxypropionate, ethyl 2-butoxypropionate, propyl 2-butoxypropionate, butyl 2-butoxypropionate, methyl 3-methoxylpropionate, ethyl 3-methoxylpropionate, propyl 3-methoxylpropionate, butyl 3-methoxylpropionate, methyl 3-ethoxylpropionate, ethyl 3-ethoxylpropionate, propyl 3-ethoxylpropionate, butyl 3-ethoxylpropionate, methyl 3-propoxylpropionate, ethyl 3-propoxylpropionate, propyl 3-propoxylpropionate, butyl 3-propoxylpropionate, methyl 3-butoxypropionate, ethyl 3-butoxypropionate, propyl 3-butoxypropionate, butyl 3-butoxypropionate or the like.

The solvent is preferably selected from diethylene glycol dimethyl ether and propylene glycol monomethyl ether acetate.

A polymerization initiator used for the copolymerization reaction can include but be not limited to azo compound or peroxide. The polymerization initiator can be used alone or in a combination two or more.

The azo compound can include but be not limited to 2,2'-azobis(isobutyronitrile), 2,2'-azobis(2,4-dimethylvaleronitrile), 2,2'-azobis(4-methoxyl-2,4-di methylvaleronitrile), 2,2'-azobis(2-methyl butyronitrile), 4,4'-azobis(4-cyano valeric acid), 2,2'-azobis(dimethyl-2-methylpropionate) or the like.

The peroxide can include but be not limited to dibenzoyl peroxide, dilauroyl peroxide, tert-butyl peroxypivalate, 1,1-di(tert-butylperoxy)cyclohexane, hydrogen peroxide or the like.

The molecule weight of the alkali-soluble resin (B) can be adjusted by using a single resin or using two or more resins with different molecular weights synergistically. The weight average molecule weight of the alkali-soluble resin (B) is 3,000 to 100,000, preferably is 4,000 to 80,000, and more preferably is 5,000 to 60,000.

Based on the total amount of the polysiloxane resin (A) as 100 parts by weight, the amount of the alkali-soluble resin (B) is 10 parts by weight to 100 parts by weight, preferably is 20 parts by weight to 100 parts by weight, and more preferably is 30 parts by weight to 100 parts by weight.

When the photosensitive resin composition of the present invention does not include the alkali-soluble resin (B), the photosensitive resin composition has defects of poor leveling resistance and poor resistance to development.

Ortho-Naphthoquinone Diazide Sulfonic Acid Ester (C)

There is no particular limitation in the ortho-naphthoquinone diazide sulfonic acid ester (C), and a conventional ortho-naphthoquinone diazide sulfonic acid ester can be used. The ortho-naphthoquinone diazide sulfonic acid ester (C) can be an ester-based compound that is completely esterified or partially esterified. The ortho-naphthoquinone diazide sulfonic acid ester (C) is preferably obtained by a reaction with o-naphthoquinone diazide sulfonic acid or the salt thereof and a hydroxy compound. More preferably, the ortho-naphthoquinone diazide sulfonic acid ester (C) is obtained by the reaction with o-naphthoquinone diazide sulfonic acid or the salt thereof and a polyhydroxy compound.

The o-naphthoquinone diazide sulfonic acid can include but be not limited to o-naphthoquinonediazide-4-sulfonic acid, o-naphthoquinonediazide-5-sulfonic acid, o-naphthoquinonediazide-6-sulfonic acid or the like. The salt of the o-naphthoquinone diazide sulfonic acid can include but be not limited to diazonaphthoquinone sulfonyl halide.

The hydroxy compound can include but be not limited to hydroxybenzophenone-based compound, hydroxyaryl-based compound, (hydroxyphenyl)hydrocarbon compound or other aromatic hydroxy compounds. The hydroxy compound can be used alone or in a combination two or more.

The aforementioned hydroxybenzophenone-based compound can include but be not limited to 2,3,4-trihydroxy benzophenone, 2,4,4'-trihydroxy benzophenone, 2,4,6-trihydroxy benzophenone, 2,3,4,4'-tetrahydroxy benzophenone, 2,4,2',4'-tetrahydroxy benzophenone, 2,4,6,3',4'-pentahydroxy benzophenone, 2,3,4,2',4'-pentahydroxy benzophenone, 2,3,4,2',5'-pentahydroxy benzophenone, 2,4,5,3',5'-pentahydroxy benzophenone, 2,3,4,3',4',5'-hexahydroxy benzophenone or the like.

The aforementioned hydroxyaryl-based compound can have the following structure shown as Formula (VI-1):

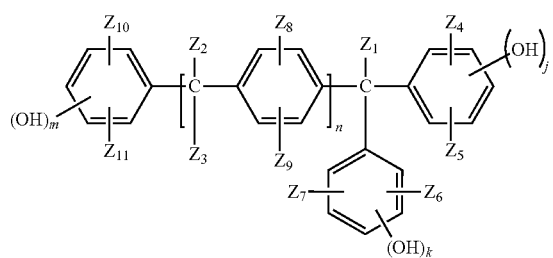

in the Formula (VI-1), $Z_1$ to $Z_3$ represent a hydrogen atom or an alkyl group of 1 to 6 carbons; $Z_4$ to $Z_9$ represents a hydrogen atom, a halogen atom, an alkyl group of 1 to 6 carbons, an alkoxy group of 1 to 6 carbons, an alkenyl of 1 to 6 carbons or cycloalkyl; $Z_{10}$ and $Z_{11}$ represents a hydrogen atom, a halogen atom and an alkyl group of 1 to 6 carbons; j, k and m represents an integer of 1 to 3; and n represents an integer of 0 or 1.

The hydroxyaryl-based compound shown as Formula (VI-1) can include but be not limited to tris(4-hydroxyphenyl)methane, bis(4-hydroxy-3,5-dimethylphenyl)-4-hydroxyphenyl methane, bis(4-hydroxy-3,5-dimethylphenyl)-3-hydroxyphenyl methane, bis(4-hydroxy-3,5-dimethylphenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane, bis(4-hydroxy-2,5-dimethylphenyl)-3,4-dihydroxyphenyl methane, bis(4-hydroxy-3,5-dimethylphenyl)-2,4-dihydroxyphenyl methane, bis(4-hydroxy-2,5-dimethylphenyl)-2,4-dihydroxyphenyl methane, bis(4-hydroxyphenyl)-3-methoxy-4-hydroxyphenyl methane, bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(3-cyclohexyl-4-hydroxy-6-methylphenyl)-2-hydroxyphenyl methane, bis(3-cyclohexyl-4-hydroxy-6-methylphenyl)-3-hydroxyphenyl methane, bis(3-cyclohexyl-4-hydroxy-6-methylphenyl)-4-hydroxyphenyl methane, bis(3-cyclohexyl-4-hydroxy-6-methylphenyl)-3,4-dihydroxyphenyl methane, bis(3-cyclohexyl-6-hydroxyphenyl)-3-hydroxyphenyl methane, bis(3-cyclohexyl-6-hydroxyphenyl)-4-hydroxyphenyl methane, bis(3-cyclohexyl-6-hydroxyphenyl)-2-hydroxyphenyl methane, bis(3-cyclohexyl-6-hydroxy-4-methylphenyl)-2-hydroxyphenyl methane, bis(3-cyclohexyl-6-hydroxy-4-methylphenyl)-4-hydroxyphenyl methane, bis(3-cyclohexyl-6-hydroxy-4-methylphenyl)-3,4-dihydroxyphenyl methane, 1-[1-(4-hydroxyphenyisopropyl]-4-[1,1-bis(4-hydroxyphenyl)ethyl]benzene, 1-[1-(3-methyl-4-hydroxyphenyisopropyl]-4-[1,1-bis(3-methyl-4-hydroxyphenyl) ethyl]benzene or the like.

The aforementioned (hydroxyphenyl)hydrocarbon compound can have the following structure shown as Formula (VI-2):

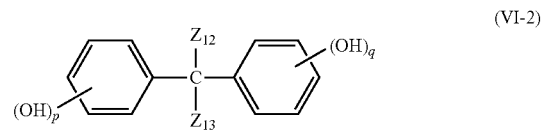

in the Formula (VI-2), $Z_{12}$ and $Z_{13}$ represents a hydrogen atom, an alkyl group of 1 to 6 carbons, and p and q represents an integer of 1 to 3.

The (hydroxyphenyl)hydrocarbon compound shown as Formula (VI-2) can include but be not limited to 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, bis(2,4-dihydroxyphenyl) methane or the like.

The aforementioned other aromatic hydroxy compounds can include but be not limited to phenol, p-methoxyphenol, dimethylphenol, hydroquinone, bisphenol A, naphthol, catechol, pyrogallol ether, pyrogallol, 1, 2, 3-pyrogallol-1,3-dimethyl ether, 3,4,5-trihydroxy benzoic acid, partially esterified or partially etherified 3,4,5-trihydroxy benzoic acid or the like.

The aforementioned hydroxy compound is preferably selected from 1-[1-(4-hydroxyphenyl)isopropyl]-4-[1,1-bis(4-hydroxyphenyl)ethyl]benzene, 2,3,4-trihydroxy benzophenone, 2,3,4,4'-tetrahydroxy benzophenone or a combination thereof.

The reaction performed to the o-naphthoquinone diazide sulfonic acid or the salt thereof with the hydroxy compound is usually performed in organic solvent, e.g., dioxane, N-pyrrolidone, or acetamide. Preferably, an alkaline condensing agent, e.g., triethanolamine, alkali metal carbonate or alkali metal bicarbonate is added.

The degree of esterification of the ortho-naphthoquinone diazide sulfonic acid ester (C) is preferably larger than or equal to 50%, i.e., based on the total amount of the hydroxyl groups in the hydroxy compound as 100 mol %, the esterification reaction is performed by 50 mol % or more hydroxyl groups in the hydroxy compound and o-naphthoquinone diazide sulfonic acid or the salt thereof. More preferably, the degree of esterification of the ortho-naphthoquinone diazide sulfonic acid ester (C) is larger than or equal to 60%.

Based on the amount of the polysiloxane resin (A) as 100 parts by weight, an amount of the ortho-naphthoquinone diazide sulfonic acid ester (C) is 3 parts by weight to 30 parts by weight, preferably is 5 parts by weight to 30 parts by weight, and more preferably is 5 parts by weight to 25 parts by weight.

Solvent (D)

There is no particular limitations in kinds of the solvent (D) of the photosensitive resin composition, and each component can completely be dissolved in the solvent (D). The solvent (D) has highly volatility, and the solvent can be evaporated with a small amount of heat under normal pressure. Preferably, the solvent (D) is selected from a solvent with a boiling point below 150° C. under normal pressure. The solvent (D) can be used alone or in a combination two or more, and the solvent (D) includes aromatic, such as benzene, toluene, xylene and the like; alcohol, such as methanol, ethanol and the like; ether, such as ethylene glycol monopropyl ether, diethylene glycol dimethyl ether, tetrahydrofuran, ethylene glycol monomethyl ether, ethylene glycol monoethyl ether, diethylene glycol methyl ether, diethylene glycol ethyl ether, diethylene glycol butyl ether and the like; esters, such as glycol monomethyl ether acetate, glycol ether acetate, propylene glycol monomethyl ether acetate, propylene glycol ethyl ether acetate, propylene glycol propyl ether acetate, ethyl 3-ethoxylpropionate, and the like; and ketones such as ethylmethyl ketone, acetone and the like. More preferably, for increasing the storage stability of the photosensitive resin composition, the solvent (D) is selected from a group consisting of diethylene glycol dimethyl ether, propylene glycol monomethyl ether acetate, ethyl 3-ethoxylpropionate and a combination thereof.

Based on an amount of the polysiloxane resin (A) as 100 parts by weight, an amount of the solvent (D) is 100 parts by weight to 1000 parts by weight, preferably is 100 parts by weight to 800 parts by weight, and more preferably is 200 parts by weight to 800 parts by weight.

Additive (E)

The photosensitive resin composition can further optionally comprises the additive (E). Depending upon actual requirements, the additive (E) can be selected by those of ordinary skills in the art. The additive (E) can include but be not limited to a filler, a polymer except the polysiloxane resin (A) and the alkali-soluble resin (B), an ultraviolet light absorber, an anti-agglutinant, a surfactant, an adherence promoter, a storage stabilizer, a heat-resistanant promoter, a hardening promoter or a combination thereof.

The filler can include but be not limited to glass or aluminum without any specific limitations.

The aforementioned polymer except the polysiloxane resin (A) and the alkali-soluble resin (A) can be polyvinyl alcohol, polyethylene glycol monoalkyl ether or polyfluoro alkyl acrylate.

There is no any specific limitation to the ultraviolet light absorber. The ultraviolet light absorber preferably can be 2-(3-t-butyl-5-methyl-2-hydroxy phenyl)-5-chlorophenyl nitrine or alkoxy benzophenone.

The anti-agglutinant can include but be not limited to polyacrylate sodium.

The surfactant can include but be not limited to fluorine containing surfactant or organic silicone surfactant. The surfactant can be used alone or in a combination two or more, and the surfactant can improve the coating ability of the photosensitive resin composition.

The aforementioned fluorine containing surfactant at least includes fluoro alkyl group or fluoro alkenyl group at the terminal group, main chain and branch chain thereof. The fluorine containing surfactant can include but be not limited to 1,1,2,2-tetrafluorohexyl(tetrafluoropropyl)ether, 1,1,2,2-tetrafluoro octylhexyl ether, octaethylene glycol di(1,1,2,2-tetrafluorobutyl)ether, hexaethylene glycol (1,1,2,2,3,3-hexafluoropentyl)ether, octapropanediol di(1,1,2,2-tetrafluorobutyl)ether, hexapropanediol (1,1,2,2,3,3-hexafluoropentyl)ether, perfluoro sodium dodecyl sulfate, 1,1,2,2,8,8,9,9,10,10-Perfluorododecane, 1,1,2,2,3,3-hexafluorodecane, fluothane benzene sulfonate, fluothane sodium phosphate, fluothane carboxylic sodium, fluothane polyethenoxy ether, dipropanetriol tetra(fluothane polyethenoxy ether), fluothane ammonium iodide, fluothane lycine, fluoroalkyl polyethenoxy ether, perfluoroalkyl polyethenoxy ether and perfluoroalkyl alkanol. Commercial products of the fluorine containing surfactant can include but be not limited to the product manufactured by BM Chemical Co., LTD., and the trade name is BM-1000, BM-1100; the product manufactured by Dainippon Ink And Chemicals, Inc., and the trade name is Megafac F142D, Megafac F172, Megafac F173, Megafac F183, Megafac F178, Megafac F191, Megafac F471 or Megafac F476; the product manufactured by Sumitomo Chemical Co., Ltd., and the trade name is Fluorad FC 170C, Fluorad FC-171, Fluorad FC-430 or Fluorad FC-431; the product manufactured by AGC Display Glass Co., Ltd., and the trade name is Surflon S-112, Surflon S-113, Surflon S-131, Surflon S-141, Surflon S-145, Surflon S-382, Surflon SC-101, Surflon SC-102, Surflon SC-103, Surflon SC-104, Surflon SC-105 or Surflon SC-106; the product manufactured by Shin-Akita Kasei Co., Ltd., and the trade name is F-Top EF301, F-Top EF303 or F-Top EF352; the product manufactured by NEOS Co., Ltd., and the trade name is Ftergent FT-100, FT-110, FT-140A, FT-150, FT-250, FT-251, FTX-251, FTX-218, FT-300, FT-310 or FT-400S.

Commercial products of the organic silicone surfactant can include but be not limited to the product manufactured by Dow Corning Toray Silicone, and the trade name is DC 3 PA, DC 7 PA, SH 11 PA, SH 21 PA, SH 28 PA, SH 29 PA, SH 30 PA, SH-190, SH-193, SZ-6032, SF-8427, SF-8428, DC-57 or DC-190; the product manufactured by GE-Toshiba Silicones Co., Ltd., and the trade name is TSF-4440, TSF-4300, TSF-4445, TSF-4446, TSF-4460 or TSF-4452.

Except the aforementioned fluorine containing surfactant or the organic silicone surfactant, the surfactant can be: (1) polyoxyethylene alkyl ether, such as lauryl alcohol polyoxyethylene ether, polyoxyethylene stearate ether, polyoxyethylene oleyl ether or the like; (2) polyoxyethylene aryl ether, such as polyoxyethylene n-octyl phenyl ether, polyoxyethylene n-nonyl phenol ether or the like; (3) polyoxyethylene dialkyl ester: polyoxyethylene dilaurate, polyoxyethylene distearate or the like; (4) nonionic surfactant: the product manufactured by Shin-Etsu Chemical Co., Ltd., and the trade name is KP-341; the product manufactured by Kyoeisha grease Chemical Industries, Ltd., and the trade name is poly flow No. 57 or poly flow No. 95.

The adherence promoter can include but be not limited to a functional silane compound, and the adherence promoter can enhance the adherence between the photosensitive resin composition and the substrate. Preferably, the functional silane compound is a silane compound containing carboxyl group, alkenyl group, isocyanate group, epoxy group, amine group, hydrosulphonyl group or halogen.

The functional silane compound can include but be not limited to p-hydroxy phenyl trimethoxysilane, 3-methacryloxypropyl trimethoxysilane, 3-acryloxypropyl trimethoxysilane, vinyl triacetoxysilane, vinyl trimethoxysilane, vinyl triethoxylsilane, vinyl tri(2-methoxyethoxyl)silane, γ-isocyanatepropyl triethoxylsilane, 3-glycidoxypropyltrimethoxysilane (such as commercial product manufactured by Shin-Etsu Chemical Co., Ltd., and the trade name is KBM403), 2-(3,4-glycidoxycyclohexyl)ethyl trimethoxysilane, 3-glycidoxypropoxyl propyl dimethyl methoxylsilane, 3-aminopropyl trimethoxysilane, N-(2-aminoethyl)-3- aminopropyl trimethoxysilane, N-(2-aminoethyl)-3-aminopropylmethyl dimethoxysilane, 3-mercaptpropyl trimethoxysilane, 3-chloropropyl trimethoxysilane, 3-chloropropylmethyl dimethoxysilane or the like. The functional silane compound can be used alone or in a combination two or more.

The storage stabilizer can include but not be limited to sulfur, quinone, hydroquinone, polyoxide, amine, nitroso compound or nitryl compound. The storage stabilizer can be 4-methoxyl phenol, (N-nitroso-N-phenyl) hydroxylamine aluminum, 2,2'-thio-bis(4-methyl-6-t-butylphenol), 2,6-di-t-butylphenol or the like.

The heat-resistanant promoter can include but be not limited to N-(alkoxymethyl) glycoluril compound and N-(alkoxymethyl) melamine.

The aforementioned N-(alkoxymethyl) glycoluril compound can include but be not limited to N,N,N',N'-tetra(methoxylmethyl)glycoluril, N,N,N',N'-tetra(ethoxylmethyl)glycoluril, N,N,N',N'-tetra(n-propoxylmethyl) glycoluril, N,N,N',N'-tetra(isopropoxylmethyl)glycoluril, N,N,N',N'-tetra(n-butoxymethyl)glycoluril and N,N,N',N'-tetra(t-butoxymethyl)glycoluril.

The N-(alkoxymethyl) glycoluril compound preferably can be N,N,N',N'-tetra(methoxylmethyl)glycoluril The aforementioned N-(alkoxymethyl) melamine can include but not be limited to N,N,N',N',N'',N''-hexa(methoxylmethyl)melamine, N,N,N',N',N'',N''-hexa(ethoxylmethyl) melamine, N,N,N',N',N'',N''-hexa(n-propoxylmethyl) melamine, N,N,N',N',N'',N''-hexa(isopropoxylmethyl) melamine, N,N,N',N',N'',N''-hexa(n-butoxymethyl) melamine and N,N,N',N',N'',N''-hexa(t-butoxymethyl) melamine.

The N-(alkoxymethyl) melamine preferably can be N,N,N',N',N'',N''-hexa(methoxylmethyl)melamine. The commercial products of the N-(alkoxymethyl)melamine are manufactured by Sanwa Chemical, and the trade names are NIKARAKKU N-2702 or MW-30M.

The hardening promoter can include but be not limited to (1) a compound having an epoxy group: the compound can include but be not limited to diglycidyl ether of bisphenol compound, such as bisphenol A diglycidyl ether, bisphenol F diglycidyl ether, bisphenol S diglycidyl ether, hexahydrohsphenol A diglycidyl ether, hexahydrohsphenol F diglycidyl ether, hexahydrohsphenol AD diglycidyl ether, brominated bisphenol A diglycidyl ether, brominated bisphenol F diglycidyl ether, brominated bisphenol S diglycidyl ether, or the like; (2) guanamine compound: the compound can include but be not limited to melamine, guanamine, acetoguanamine, benzoguanamine or the like; (3) amine compound: the compound can include but be not limited to dicyandiamide, dimethylbenzylamine, 4-(dimethylamine)-N,N-dimethylbenzylamine, 4-methoxy-N,N-dimethylbenzylamine, 4-methyl-N,N-dimethylbenzylamine or the like; (4) imidazole derivatives and the salt thereof: the compound can include but be not limited to imidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole or the like.

According to the requirements, the amount of the additives (E) can be adjusted by those skilled in the art. Based on the total amount of the polysiloxane resin (A) as 100 parts by weight, the amount of the additive (E) is 0 parts by weight to 30 parts by weigh, preferably is 0 parts by weight to 25 parts by weight, and more preferably is 0 parts by weight to 20 parts by weight.

Producing Photosensitive Resin Composition

The photosensitive resin composition is manufactured by mixing the polysiloxane resin (A), the alkali-soluble resin (B), the ortho-naphthoquinone diazide sulfonic acid ester (C) and the solvent (D) in a mixer uniformly to form a solution. If necessary, the additive (E) can optionally be added Producing Protective Film and Element Having Protective Film The protective film is obtained by coating the aforementioned photosensitive resin composition onto a substrate, and then the substrate is subjected to a pre-bake treatment, an exposing treatment, a developing treatment and a post-bake treatment.

The aforementioned substrate is selected from alkali-free glass, soda-lime glass, Pyrex glass, quartz glass, a glass substrate coated with a transparent conductive film thereon or the like, and a photoelectric conversion substrate (such as a silicon substrate) used in a solid-state image sensor.

There is no particular limitation in the coating method of the protective film of the present invention. The photosensitive resin composition can be coated onto the substrate by spray coating, roll coating, spin coating, slot die coating, bar coating, ink-jet printing or the like. The aforementioned coating method is preferably spin coating or slot die coating.

Then, the pre-bake treatment is performed to the substrate coated with the photosensitive rein composition thereon to remove the solvent, thereby forming a pre-bake coating film. According to the differences of the compositions and the ration thereof, the parameters of the pre-bake treatment are different. The pre-bake treatment is generally performed at 60° C. to 110° C. for 30 seconds to 15 minutes. A thickness of the pre-bake coating film is preferably 3 µm to 6 µm.

After the pre-bake treatment is performed, the pre-bake coating film is placed under a mask and the pre-bake coating film is subjected to the exposing treatment. A light of the exposing treatment can include but be not limited to ultraviolet light, far ultraviolet light, X-ray or charged particle beam. The ultraviolet light can be g-line (the wavelength is 436 nm), h-line, I-line (the wavelength is 365 nm) or the like. The far ultraviolet light can be KrF excimer laser or the like. The X-ray can be synchronous acceleration radiation or the like. The charged particle beam can be electron beam or the like. The light of the exposing treatment is preferably the ultraviolet light, and more preferably is g-line or I-line. When the light of the exposing treatment is ultraviolet light, the ultraviolet light radiation device can include but be not limited to a high-pressure mercury lamp, an ultra-high pressure mercury lamp and a metal halide lamp. The exposing energy of the exposing treatment is preferably 50 $J/m^2$ to 1500 $J/m^2$.

The exposed pre-bake coating film is immersed into a developing solution to subject to the aforementioned developing treatment. According to the difference of the photosensitive resin composition, the developing treatment is performed for 30 seconds to 2 minutes to remove undesired portions, thereby forming a desired pattern. For example, the developing solution can be (1) inorganic base: sodium hydroxide, potassium hydroxide, sodium carbonate, sodium silicate, metasilicate sodium or ammonia; (2) the primary fatty amine: ethylamine or n-propylamine; (3) the secondary fatty amine: diethylamine or n-propylamine; (4) the tertiary fatty amine: trimethylamine, diethylamine methyl, dimethylethylamine or triethylamine; (5) the tertiary fatty cyclo-acid: pyrrole, piperidine, N-methyl piperidine, N-methyl 1,8-diazabicyclo[5.4.0]-7-undecylene or 1,5-diazabicyclo [4.3.0]-5-nonene; (6) the third-grade aromatic amine: pyridine, methylpyrimidine, dimethyl pyridine or quinoline; (7) the quaternary ammonium salt alkaline compound: aqueous solutions of tetramethyl ammonium hydroxide or tetraethyl ammonium hydroxide.

Furthermore, the aforementioned developing solution can optionally include a water-soluble organic solvent and/or a surfactant, such as methanol or ethanol. Besides, the developing method can include but be not limited to a soaking method, an immersion method, a shaking immersion method, a showering method, or the suitable like.

When the developing solution is composed of the aforementioned alkali compound, the film is washed by water after the developing treatment is performed, and then the film is dried through a compressed air or nitrogen. Preferably, after the developing treatment is performed, the film can optionally be subjected to a post-exposing treatment by a high pressure mercury lamp to totally irradiate the coating film, thereby decomposing the residual ortho-naphthoquinone diazide sulfonic acid ester (C). The exposing energy of the post-exposing treatment is preferably 2000 $J/m^2$ to 5000 $J/m^2$.

After the developing treatment is performed, the post-bake treatment is performed by a hot plate, an oven or the like to curing the developed pre-bake coating film. The post-bake temperature is generally 120° C. to 250° C. The post-bake period can be adjusted by the difference of the heating device, such as the post-bake period is 5 minutes to 30 minutes when the post-bake treatment is performed by the hot plate, and the post-bake period is 30 minutes to 90 minutes when the post-bake treatment is performed by the oven. After the aforementioned treating process, the protective film is produced.

The element having the protective film of the present invention includes a substrate and the aforementioned protective film covered on the substrate. For example, the element having the protective film can be a display element, a semiconductor element, a core material or a covering material of an optical waveguide or the like.

Several embodiments are described below to illustrate the application of the present invention. However, these embodiments are not used for limiting the present invention. For those skilled in the art of the present invention, various variations and modifications can be made without departing from the spirit and scope of the present invention.

DETAILED DESCRIPTION

Producing Polysiloxane Resin (A)

The polysiloxane resins (A) of Synthesis Examples A-1 to A-6 were prepared according to Table 1 as follow.

Synthesis Example A-1

0.03 mole of methylmethoxy silane (hereinafter abbreviated as MTMS), 0.65 mole of phenyltrimethoxy silane (hereinafter abbreviated as PTMS), 0.05 mole of 3-(triethoxysilyl) propyl succinic anhydride (hereinafter abbreviated as GF-20) and 200 g of propylene glycol monoethyl ether (hereinafter abbreviated as PGEE) were added into a 500 ml of three-necked flask. The solution was stirred at room temperature and oxalic acid solution (0.40 g oxalic acid/75 g water) was added into the solution on 30 minutes. Then, a temperature of the oil bath was increased to 120° C. When a temperature of the solution was cooled to 105° C., the solution was continuously stirred to subject to a polymerization reaction.

After 6 hours, the solvent was distilled to obtain the polysiloxane resin (A-1).

Synthesis Examples A-2 to A-6

Synthesis Examples A-2 to A-6 were made by the same method as in Synthesis Example A-1 by using various kinds or amounts of the components for the polysiloxane resin. The formulations and detection results thereof were listed in Table 1 rather than focusing or mentioning them in details.

Producing Alkali-Soluble Resin (B)

The alkali-soluble resins (B) of Synthesis Examples B-1 to B-11 were prepared according to Table 2 as follow.

Synthesis Example B-1

A 1000 ml four-necked flask equipped with a nitrogen inlet, a stirrer, a heater, a condenser and a thermometer was purged with nitrogen gas. 5 parts by weight of methacrylic acid (hereinafter abbreviated as b1-1), 15 parts by weight of 9,9'-bis[3-phenyl-4-(2-methacryloyloxyethoxy)phenyl]fluorene (hereinafter abbreviated as b2-2), 80 parts by weight of tert-butoxystyene (hereinafter abbreviated as b3-2) and 240 parts by weight of diethylene glycol dimethyl ether (hereinafter abbreviated as diglyme) were added into the four-necked flask in an one-time manner.

After the flask was filled with nitrogen gas, reactants in the flask were mixed uniformly and the temperature of an oil bath was increased to 85° C. 3 parts by weight of 2,2'-Azobis (2,4-dimethylvaleronitrile) (hereinafter abbreviated as ADVN) was dissolved in 20 parts by weight of diglyme to form a ADVN solution. The ADVN solution was divided into five equal parts, and each part of the ADVN solution was added in turn into the four-necked flask at the same interval in one hour. The polymerization reaction was performed at 70° C. After 5 hours, a polymerization product was taken out and the solvent was removed, thereby obtaining the alkali-soluble resin (B-1).

Synthesis Examples B-2 to B-11

Synthesis Examples B-2 to B-11 were made by the same method as in Synthesis Example B-1 with various kinds or amounts of the components for the alkali-soluble resin (B). The formulations and polymerization conditions of the alkali-soluble resins (B-2) to (B-11) were listed in Table 2 rather than focusing or mentioning them in details.

Producing Photosensitive Resin Composition

The photosensitive resin composition of Examples 1 to 8 and Comparative Examples 1 to 5 were prepared according to Table 3.

Example 1

100 parts by weight of the polysiloxane resin of the aforementioned Synthesis Example A-1, 10 parts by weight of the alkali-soluble resin of the aforementioned Synthesis Example B-1, 3 parts by weight of ortho-naphthoquinone diazide sulfonic acid ester (hereinafter abbreviated as C-1) synthesized with 1-[1-(4-hydroxyphenyl)isopropyl]-4-[1,1- bis(4-hydroxyphenyl)ethyl]benzene and o-naphthoquinonediazide-5-sulfonic, and 100 parts by weight of propylene glycol monomethyl ether acetate (PGMEA; hereinafter abbreviated as D-1) were added into a 500 ml of three-necked flask. The composition was mixed uniformly by a shaking mixer, thereby obtaining the photosensitive resin of the Example 1. The resulted photosensitive resin composition was determined according to the following method of evaluating the resistance to development and the leveling resistance, and the results were listed as Table 3. The evaluation methods of the resistance to development and the leveling resistance were described as follow.

Examples 2 to 8 and Comparative Examples 1 to 5

Examples 2 to 8 and Comparative Examples 1 to 5 were made by the same method as in Example 1 with various kinds and amounts of ingredients of the photosensitive resin composition. The formulations and evaluation results of the photosensitive resin compositions of Examples 2 to 8 and Comparative Examples 1 to 5 were listed in Table 3 rather than focusing or mentioning them in details.

Producing Protective Film

The photosensitive resin compositions of Examples 1 to 8 and Comparative Examples 1 to 5 were made to form protective films respectively by using the producing method of the protective film as aforementioned.

Application Example 1

The photosensitive resin composition of Example 1 was spin-coated on a prime glass substrate of 100 mm*100 mm*0.7 mm in size, and then pre-baked for 2 minutes at 110° C. to obtain a pre-coated film of about 2 μm in thickness. Next, a mask for positive photo resist was interposed between an exposure machine (manufactured by M&R Nano Technology, and the trade name is AG500-4N) and the pre-coated film, and the ultraviolet light of 200 mJ/cm² was used to irradiate the pre-coated film. And then, the exposed pre-coated film was immersed into the developing solution of 0.4 wt % tetramethylammonium hydroxide pentahydrate at 23° C. for 1 minute, so as to remove the exposed portion. After the film was washed by pure water, the developed pre-coated film was directly irradiated by the exposure machine, and the exposing energy was 300 mJ/cm². Afterwards, the film was pre-coated at 230° C. for 60 minutes, thereby obtaining the patterned protective film on the prime glass substrate.

Application Examples 2 to 8 and Comparative Application Examples 1 to 5

Application Examples 2 to 8 and Comparative Application Examples 1 to 5 were made by the same method of Application Example 1 with various kinds or amounts of ingredients of the photosensitive resin compositions of Examples 2 to 8 and Comparative Examples 1 to 5.

Evaluation Methods

1. Resistance to Development
The photosensitive resin composition of Examples 1 to 8 and Comparative Examples 1 to 5 were respectively spin-coated on a prime glass substrate of 100 mm*100 mm*0.7 mm in size, and then pre-baked for 2 minutes at 110° C. to obtain a pre-coated film of about 2 μm in thickness. Next, a mask for positive photo resist was interposed between an exposure machine (manufactured by M&R Nano Technology, and the trade name is AG500-4N) and the pre-coated film, and the ultraviolet light of 200 mJ/cm² was used to irradiate the pre-coated film. A film thickness (i.e. a film thickness before the developing treatment) of the exposed pre-coated film was measured. And then, the exposed pre-coated film was immersed into the developing solution of 0.4 wt % tetramethylammonium hydroxide pentahydrate at 23° C. for 1 minute, so as to remove the exposed portion. After the film was washed by pure water, a dot pattern array was obtained. A thickness (defined as a film thickness after the developing treatment) of the dot pattern array was measured. A film thickness ratio was calculated according to the following Formula (VII), and an evaluation was made according to the following criterion. The result was listed in Table 3:

$$\text{film thickness ratio} = \frac{\text{film thickness after developing treatment}}{\text{film thickness before developing treatment}} \times 100\% \quad \text{(VII)}$$

⊚: 98%≤film thickness ratio;
○: 95%≤film thickness ratio<98%;
Δ: the pattern was peeled off partially;
x: the pattern was peeled completely.

2. Leveling Resistance
The photosensitive resin composition of Examples 1 to 8 and Comparative Examples 1 to 5 were respectively spin-coated on a prime glass substrate of 100 mm*100 mm*0.7 mm in size, and then pre-baked for 2 minutes at 110° C. to obtain a pre-coated film of about 2 μm in thickness. Then, a mask for positive photo resist was interposed between an exposure machine (manufactured by M&R Nano Technology, and the trade name is AG500-4N) and the pre-coated film, and the ultraviolet light of 200 mJ/cm² was used to irradiate the pre-coated film. The exposed pre-coated film was immersed into the developing solution of 0.4 wt % tetramethylammonium hydroxide pentahydrate at 23° C. to remove the exposed portion. After 1 minute, the developed pre-coated film was washed by pure water to obtain a patterned substrate with a pattern of 15 μm in line width.

Then, the aforementioned pattern substrate was placed in an oven at 220° C. After 1 hour, the temperature was increased to 230° C. for 10 minutes to melt the pattern on the pattern substrate. A size of the bottom of the pattern was measured by scanning electron microscope (SEM), and an evaluation was made according to the following criterion. The result was listed in Table 3:

⊚: 15 μm≤the size of the bottom of the pattern<18 μm;
○: 18 μm≤the size of the bottom of the pattern<20 μm;
x: 20 μm≤the size of the bottom of the pattern.

According to Table 3, when the photosensitive resin composition includes the polysiloxane resin (A), the photosensitive resin composition has an excellent leveling resistance. When the polysiloxane resin (A) is formed by poly-condensing the siloxane monomer having a structure of Formula (I), and at least one $Y_1$ represents an alkyl group having an anhydride group, an alkyl group having an epoxy group or an alkoxy group having an epoxy group, the photosensitive resin composition has a better leveling resistance.

Moreover, when the photosensitive resin composition includes the alkali-soluble resin (B), the photosensitive resin composition has a good leveling resistance and resistance to development.

Furthermore, when the alkali-soluble resin (B) includes a comonomer of the fluorene derivative having a double-bond group (b2), the photosensitive resin composition has an excellent leveling resistance and resistance to development. When the alkali-soluble rein (B) includes a comonomer of the unsaturated compound having an acid-decomposable group (b3), the photosensitive resin composition has an excellent leveling resistance and resistance to development.

Besides, when the photosensitive resin (B) includes a comonomer of the unsaturated compound having epoxy group (b4), the photosensitive resin composition has better leveling resistance and resistance to development.

Comparative Example 6

100 parts by weight of the polysiloxane resin (A) of the aforementioned Synthesis Example A-4, 20 parts by weight of the alkali-soluble resin of the aforementioned Synthesis Example B-10, 10 parts by weight of ortho-naphthoquinone diazide sulfonic acid ester (hereinafter abbreviated as C-2) synthesized with 2,3,4-trihydroxy benzophenone and o-naphthoquinonediazide-5-sulfonic and 5 parts by weight of 9,9'-bis[4-(2-methacryloyloxyethoxy)phenyl]fluorene (hereinafter abbreviated as b2-1) were poured into 300 parts by weight of diethylene glycol dimethyl ether (hereinafter abbreviated as D-1), and the solution was mixed uniformly by a shaking mixer, thereby obtaining the photosensitive resin composition of Comparative Example 6. The photosensitive resin composition was determined according to the aforementioned method of evaluating the resistance to development and the leveling resistance. After Comparative Example 6 was determined by the aforementioned method, the resistance to development and the leveling resistance were determined as the symbol x.

According to Comparative Example 6, when the alkali-soluble resin (B) does not include a comonomer of the fluorene derivative having a double-bond group (b2), the photosensitive resin composition has defects of poor resistance to development and poor leveling resistance even if the photosensitive resin composition includes the fluorene derivative having a double-bond group (b2).

It should be supplemented that, although specific compounds, components, specific reactive conditions, specific processes, specific evaluation methods or specific equipments are employed as exemplary embodiments of the present invention, for illustrating the photosensitive resin composition and the application thereof of the present invention. However, as is understood by a person skilled in the art instead of limiting to the aforementioned examples, the photosensitive resin composition and the application thereof of the present invention also can be manufactured by using other compounds, components, reactive conditions, processes, analysis methods and equipment without departing from the spirit and scope of the present invention.

As is understood by a person skilled in the art, the foregoing preferred embodiments of the present invention are illustrated of the present invention rather than limiting of the present invention. In view of the foregoing, it is intended to cover various modifications and similar arrangements included within the spirit and scope of the appended claims. Therefore, the scope of which should be accorded the broadest interpretation so as to encompass all such modifications and similar structure.

TABLE 1

| Synthesis Example | Composition Silane Monomer/Polysiloxane (mole) | | | | | | | | | |
|---|---|---|---|---|---|---|---|---|---|---|
| | MTMS | DMDMS | PTMS | PTES | GF-20 | TMSG | TMSOX-D | ECETES | TESOX-D | DMS-S27 |
| A-1 | 0.30 | | 0.65 | | 0.05 | | | | | |
| A-2 | | 0.40 | 0.40 | 0.20 | | | | | | |
| A-3 | | 0.60 | 0.35 | | | 0.05 | | | | |
| A-4 | 0.65 | | | 0.25 | | | 0.09 | | | 0.01 |
| A-5 | 0.60 | | 0.30 | | | | | 0.08 | 0.02 | |
| A-6 | | 0.50 | | 0.40 | | | | | 0.10 | |

| Synthesis Example | Composition | | | | | |
|---|---|---|---|---|---|---|
| | Solvent (g) | | Catalyst (g) | | Polymerizing | |
| | PGEE | DAA | DI Water | Oxalic Acid | Temperature (° C.) | Copolymerizing Period (hours) |
| A-1 | 200 | | 75 | 0.40 | 105 | 6 |
| A-2 | 100 | 100 | 75 | 0.40 | 110 | 5 |
| A-3 | 200 | | 75 | 0.35 | 105 | 6 |
| A-4 | 200 | | 75 | 0.45 | 110 | 6 |
| A-5 | 200 | | 75 | 0.40 | 110 | 5 |
| A-6 | 100 | 100 | 75 | 0.40 | 105 | 6 |

| Compound | | $M_w$ |
|---|---|---|
| MTMS | Methyltrimethoxysilane | 136 |
| DMDMS | Dimethyldimethoxysilane | 120 |
| PTMS | Phenyltrimethoxysilane | 198 |
| PTES | Phenyltriethoxysilane | 240 |
| GF-20 | 3-(triethoxysilyl)propyl succinic anhydride | 304 |

TABLE 1-continued

| TMSG | 3-(trimethoxysilyl)propyl glutaric anhydride | 276 |
| TMSOX-D | 2-oxetanylbutoxypropyltrimethoxy silane | 278 |
| ECETES | 2-(3,4-epoxycyclohexyl)ethyltrimethoxysilane | |
| TESOX-D | 2-oxetanylbutoxypropyltriethoxysilane | |
| DMS-S27 | Silanol terminated polydimethylsiloxane manufactured by Gelest, Inc. | 18000 |
| PGEE | Propylene glycol monoethyl ether | 104 |
| DAA | 4-hydroxy-4-methyl-2-pentanone | 116 |
| DI water | | 18 |
| Oxalic acid | | 90 |

TABLE 2

| | Composition Monomer (parts by weight) | | | | | | | | | | | | | | | |
|---|---|---|---|---|---|---|---|---|---|---|---|---|---|---|---|---|
| Synthesis | (b1) | | | (b2) | | | (b3) | | | (b4) | | | (b5) | | | |
| Example | b1-1 | b1-2 | b1-3 | b2-1 | b2-2 | b2-3 | b3-1 | b3-2 | b3-3 | b4-1 | b4-2 | b4-3 | b5-1 | b5-2 | b5-3 | b5-4 |
| B-1 | 5 | | | | 15 | | | 80 | | | | | | | | |
| B-2 | | | 10 | 40 | | | 50 | | | | | | 25 | 25 | | |
| B-3 | | 15 | | | 30 | | | 55 | | | | 50 | | | | |
| B-4 | | | 20 | | | 70 | 10 | | | | | | | | | 1 |
| B-5 | 5 | | 5 | 25 | | | 50 | 15 | | 1 | | | | | | |
| B-6 | | 29 | | | | 70 | | | 1 | | | | | | 15 | 20 |
| B-7 | 10 | | | 40 | 30 | | 20 | | | | | | 10 | | | |
| B-8 | | | 15 | | 50 | | | 35 | | | 15 | | | | | |
| B-9 | 30 | | | 70 | | | | | | | | | | 10 | | 30 |
| B-10 | | | 20 | | | | 80 | | | | 20 | | 10 | | 30 | |
| B-11 | | 100 | | | | | | | | | | | 40 | 20 | | 40 |

| | Composition | | | | | |
|---|---|---|---|---|---|---|
| Synthesis | Solvent (parts by weight) | | Catalyst (parts by weight) | | Reacting Temperature | Copolymerizing |
| Example | Diglyme | PGMEA | AMBN | ADVN | (° C.) | Period (hours) |
| B-1 | 250 | | | 3.0 | 70 | 5 |
| B-2 | | 500 | | 3.5 | 70 | 6 |
| B-3 | 500 | | 2.5 | | 70 | 6 |
| B-4 | 250 | | | 2.5 | 75 | 5 |
| B-5 | | 250 | 2.5 | | 70 | 5 |
| B-6 | 400 | | | 3.0 | 75 | 5 |
| B-7 | 250 | | 2.5 | | 70 | 5 |
| B-8 | | 250 | 2.5 | | 75 | 6 |
| B-9 | 100 | 200 | | 3.0 | 70 | 5 |
| B-10 | 200 | 100 | 3.0 | | 70 | 5 |
| B-11 | 500 | | | 3.5 | 70 | 5 | b1-1 methacrylic acid
b1-2 acrylic acid
b1-3 2-methacryloyloxyethyl succinate monoester
b2-1 9,9'-bis[4-(2-methacryloxyethoxy)phenyl]fluorene
b2-2 9,9'-bis[3-phenyl-4-(2-methacryloxyethoxy)phenyl]fluorene
b2-3 9,9'-bis[4-(2-hydroxy-3-acryloxypropoxy)phenyl]fluorene
b3-1 tetrahydropyranyloxy styrene
b3-2 tert-butoxystyene
b3-3 4-(ethoxyethoxy)styrene
b4-1 glycidyl methacylate
b4-2 3,4-epoxycyclohexylmethyl methacrylate
b4-3 p-vinylbenzylglycidylether
b5-1 2-hydroxyethyl methacrylate
b5-2 dicyclopentanyl methacrylate
b5-3 benzyl methacrylate
b5-4 styrene
Diglyme diethylene glycol dimethyl ether
PGMEA propylene glycol monoethyl ether acetate
AMBN 2,2'-azobis-2-methyl butyronitrile
ADVN 2,2'-azobis(2,4-dimethylvaleronitrile)

TABLE 3

| Composition (Parts by Weight) | | Example | | | | | | | | Comparative Example | | | | |
|---|---|---|---|---|---|---|---|---|---|---|---|---|---|---|
| | | 1 | 2 | 3 | 4 | 5 | 6 | 7 | 8 | 1 | 2 | 3 | 4 | 5 |
| Polysiloxane Resin (A) | A-1 | 100 | | | | | | | | 100 | | | | |
| | A-2 | | 100 | | | | | 50 | | | | | | 100 |
| | A-3 | | | 100 | | | | | 30 | | 100 | | | |
| | A-4 | | | | 100 | | | | 70 | | | | 100 | |
| | A-5 | | | | | 100 | | 50 | | | | | | |
| | A-6 | | | | | | 100 | | | | | | | |
| Alkali-soluble Resin (B) | B-1 | 10 | | | | | | | | | 50 | | | |
| | B-2 | | 30 | | | | | | | | | | | |
| | B-3 | | | 50 | | | | 20 | | | | | | |
| | B-4 | | | | 70 | | | | | | | | | |
| | B-5 | | | | | 100 | | | 30 | | | | | |
| | B-6 | | | | | | | 20 | | | | | | |
| | B-7 | | | | | | | | 10 | | | | | |
| | B-8 | | | | | | 60 | | | | | | | |
| | B-9 | | | | | | | | | | | 10 | | |
| | B-10 | | | | | | | | | | | | 20 | |
| | B-11 | | | | | | | | | | | | | 40 |
| Ortho-naphthoquinone Diazide Sulfonic Acid Ester (C) | C-1 | 3 | 5 | 10 | 10 | | 30 | | | 15 | 5 | 10 | | |
| | C-2 | | | | 5 | 20 | | | 10 | | | | 10 | 10 |
| | C-3 | | | | | | | 15 | | | | | | |
| Solvent (D) | D-1 | 100 | 300 | 300 | | 500 | 800 | | 500 | 300 | 200 | | 300 | 300 |
| | D-2 | | | | 500 | 500 | | 300 | | | | 500 | | |
| | D-3 | | | 200 | | | | | | | | | | |
| Additive (E) | E-1 | | | | 2 | | | | | | | | | |
| | E-2 | | | | | | | | 1 | | | | | |
| Evaluation Method | Resistance to Development | ○ | ○ | ◎ | ○ | ◎ | ◎ | ○ | ◎ | X | Δ | X | X | X |
| | Leveling Resistance | ○ | ○ | ◎ | ○ | ◎ | ◎ | ○ | ◎ | X | X | X | X | X |

C-1 ortho-naphthoquinone diazide sulfonic acid ester synthesized with 1-[1-(4-hydroxyphenyl)isopropyl]-4-[1,1-bis(4-hydroxyphenyl)ethyl]benzene and o-naphthoquinonediazide-5-sulfonic
C-2 ortho-naphthoquinone diazide sulfonic acid ester synthesized with 2,3,4-trihydroxy benzophenone and o-naphthoquinonediazide-5-sulfonic
C-3 ortho-naphthoquinone diazide sulfonic acid ester synthesized with 2,3,4,4'-Tetrahydroxybenzophenone and o-naphthoquinonediazide-5-sulfonic
D-1 propylene glycol monomethyl ether acetate (PGMEA)
D-2 4-hydroxy-4-methyl-2-pentanone (DAA)
D-3 cyclohexanone
E-1 SF-8427 (manufactured by Dow Corning Toray Silicone)
E-2 3-glycidoxypropyltrimethoxysilane (manufactured by Shin-Etsu Chemical Co., Ltd.; the trade name is KBM403)

What is claimed is:

1. A photosensitive resin composition, comprising:

a polysiloxane resin (A), obtained by polycondensing a silane monomer shown as Formula (I):

$$Si(Y_1)_a(OY_2)_{4-a} \quad (I)$$

in the Formula (I), the $Y_1$ respectively represents a hydrogen atom, an alkyl group of 1 to 10 carbons, an alkene group of 2 to 10 carbons, an aromatic group of 6 to 15 carbons, an alkyl group having an anhydride group, an alkyl group having an epoxy group or an alkoxy group having an epoxy group; the $Y_2$ respectively represents a hydrogen atom, an alkyl group of 1 to 6 carbons, an acetyl group of 1 to 6 carbons or an aromatic group of 6 to 15 carbons; and the a represents an integer of 0 to 3;

an alkali-soluble resin (B) copolymerized by an unsaturated carboxylic acid or unsaturated carboxylic anhydride compound (b1), a fluorene derivative having a double-bond group (b2) and an unsaturated compound having an acid-decomposable group (b3), wherein the unsaturated compound having an acid-decomposable group (b3) has a structure of Formula (IV):

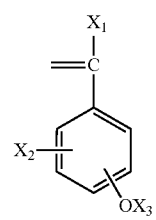

(IV)

in the Formula (IV), the $X_1$ represents a hydrogen atom or an alkyl group of 1 to 3 carbons; the $X_2$ represents a hydrogen atom, an alkyl group of 1 to 30 carbons or an aromatic group of 6 to 30 carbons, and the alkyl group represents a linear alkyl group, a branched alkyl group or a cycloalkyl group; the $X_3$ represents an alkyl group of 1 to 40 carbons, a trialkyl silane group, an oxoalkyl group or a structure of Formula (IV), and the alkyl group represents a linear alkyl group, a branched alkyl group or a cycloalkyl group, wherein each alkyl group of the trialkyl silane group has 1 to 6 carbons, and each alkyl group of the oxoalkyl group has 4 to 20 carbons:

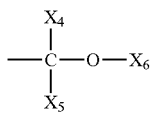

(V)

in the Formula (V), the $X_4$ represent a hydrogen atom or an alkyl group of 1 to 10 carbons, and the alkyl group represents a linear alkyl group, a branched alkyl group or a cycloalkyl group; the $X_5$ and the $X_6$ respectively represent a hydrogen atom, a linear alkyl group of 1 to 10 carbons, a branched group of 4 to 10 carbons or a cycloalkyl group of 3 to 10 carbons; and when the $X_5$ and the $X_6$ represent the linear alkyl group or the branched alkyl group, the $X_5$ and the $X_6$ are boned to form a ring structure;

an ortho-naphthoquinone diazide sulfonic acid ester (C); and a solvent (D).

2. The photosensitive resin composition of claim 1, wherein at least one $Y_1$ represents an alkyl group having an anhydride group, an alkyl group having an epoxy group or an alkoxy group having an epoxy group.

3. The photosensitive resin composition of claim 1, wherein the fluorene derivative having a double-bond group (b2) has a structure shown as Formula (II):

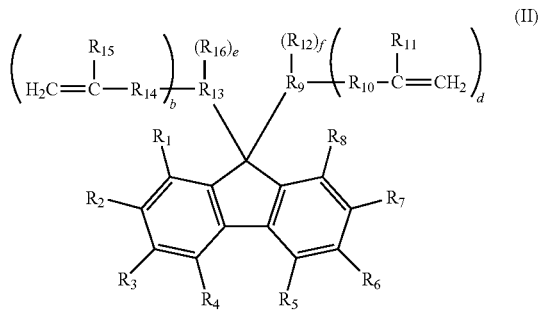

(II)

in the Formula (II), the $R_1$ to the $R_8$ are the same or different, and the $R_1$ to the $R_8$ respectively represent a hydrogen atom, a halogen atom, a cyano group or an alkyl group; the $R_9$ and the $R_{13}$ are the same or different, and the $R_9$ and the $R_{13}$ respectively represent an aromatic group or a heterocyclic group; the $R_{10}$ and the $R_{14}$ are the same or different, and the $R_{10}$ and the $R_{14}$ respectively represent a single bond or an organic group; the $R_{11}$ and the $R_{15}$ are the same or different, and the $R_{11}$ and the $R_{15}$ respectively represent a hydrogen atom or a methyl group; the $R_{12}$ and the $R_{16}$ are the same or different, and the $R_{12}$ and the $R_{16}$ respectively represent a hydrogen atom, a halogen atom, an alkyl group, a cycloalkyl group, an aromatic group, an alkyl aromatic group, an alkoxy group, a cycloalkyloxy group, an aroxyl group, an acyl group, a nitro group, a cyano group or an amine group; the b and the d respectively represent an integer of 1 to 3; and the e and the f respectively represent an integer of 0 to 3.

4. The photosensitive resin composition of claim 3, wherein the fluorene derivative having a double-bond group (b2) has a structure of Formula (III):

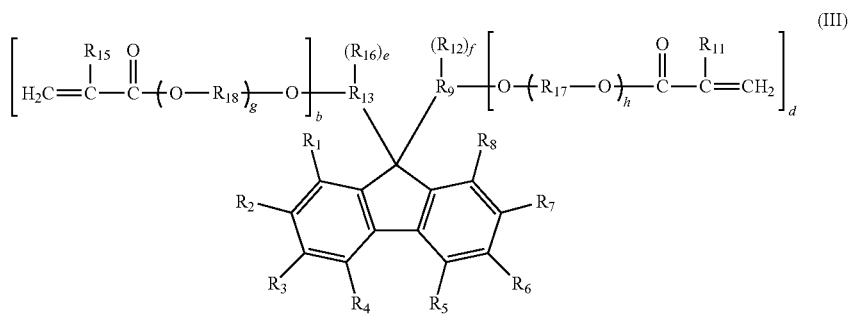

(III)

in the Formula (III), the $R_1$ to the $R_8$ are the same or different, and the $R_1$ to the $R_8$ respectively represent a hydrogen atom, a halogen atom, a cyano group or an alkyl group; the $R_9$ and the $R_{13}$ are the same or different, and the $R_9$ and the $R_{13}$ respectively represent an aromatic group or a heterocyclic group; the $R_{17}$ and the $R_{18}$ are a divalent alkyl group or a hydroxyl-substituted divalent alkyl group; the $R_{11}$ and the $R_{15}$ are the same or different, and the $R_{11}$ and the $R_{15}$ respectively represent a hydrogen atom or a methyl group; the $R_{12}$ and the $R_{16}$ are the same or different, and the $R_{12}$ and the $R_{16}$ respectively represent a hydrogen atom, a halogen atom, an alkyl group, a cycloalkyl group, an aromatic group, an alkyl aromatic group, an alkoxy group, a cycloalkyloxy group, an aroxyl group, an acyl group, a nitro group, a cyano group or an amine group; the b and the d respectively represent an integer of 1 to 3; the e and the f respectively represent an integer of 0 to 3; and the g and the h respectively represent an integer of 0 to 10.

5. The photosensitive resin composition of claim 1, wherein based on a total amount of the unsaturated carboxylic acid or unsaturated carboxylic anhydride compound (b1), the fluorene derivative having a double-bond group (b2) and the unsaturated compound having an acid-decomposable group (b3) as 100 parts by weight, an amount of the unsaturated carboxylic acid or unsaturated carboxylic anhydride compound (b1) is 5 parts by weight to 29 parts by weight, an amount of the fluorene derivative having a double-bond group (b2) is 15 parts by weight to 70 parts by weight, and an amount of the unsaturated compound having an acid-decomposable group (b3) is 1 part by weight to 80 parts by weight.

6. The photosensitive resin composition of claim 1, wherein the alkali-soluble resin (B) is copolymerized by the unsaturated carboxylic acid or unsaturated carboxylic anhydride compound (b1), the fluorene derivative having a double-bond group (b2), the unsaturated compound having an acid-decomposable group (b3), an unsaturated compound having epoxy group (b4) and/or an other unsaturated compound (b5).

7. The photosensitive resin composition of claim 1, wherein based on an amount of the polysiloxane resin (A) as 100 parts by weight, an amount of the alkali-soluble resin (B) is 10 parts by weight to 100 parts by weight, an amount of the ortho-naphthoquinone diazide sulfonic acid ester (C) is 3 parts by weight to 30 parts by weight, and an amount of the solvent (D) is 100 parts by weight to 1000 parts by weight.

* * * * *